(12) United States Patent
Salcedo et al.

(10) Patent No.: US 7,868,387 B2
(45) Date of Patent: Jan. 11, 2011

(54) LOW LEAKAGE PROTECTION DEVICE

(75) Inventors: Javier A. Salcedo, Lawrence, MA (US);
Jean-Jacques Hajjar, Lexington, MA
(US); Todd Thomas, San Jose, CA (US)

(73) Assignee: Analog Devices, Inc., Norwood, MA (US)

(*) Notice: Subject to any disclaimer, the term of this patent is extended or adjusted under 35 U.S.C. 154(b) by 211 days.

(21) Appl. No.: 12/139,244

(22) Filed: Jun. 13, 2008

(65) Prior Publication Data
US 2009/0309128 A1 Dec. 17, 2009

(51) Int. Cl.
*H01L 23/60* (2006.01)
(52) U.S. Cl. .................. 257/362; 257/120; 257/173; 257/566; 257/511; 257/E27.057; 257/546; 438/529; 438/224; 438/228; 438/237; 438/326
(58) Field of Classification Search ................ 257/362, 257/566, 511, 546, 120, 173, E27.057; 438/529, 438/224, 228, 237, 326, FOR. 187
See application file for complete search history.

(56) References Cited

U.S. PATENT DOCUMENTS

| | | | |
|---|---|---|---|
| 5,137,838 A | 8/1992 | Ramde et al. ............ | 437/24 |
| 5,468,984 A | 11/1995 | Efland et al. ............ | 257/356 |
| 5,670,799 A * | 9/1997 | Croft ..................... | 257/173 |
| 5,903,032 A | 5/1999 | Duvvury ................. | 257/356 |
| 6,064,249 A | 5/2000 | Duvvury et al. ......... | 327/314 |
| 6,329,694 B1 * | 12/2001 | Lee et al. ................ | 257/372 |
| 6,707,110 B2 * | 3/2004 | De Heyn et al. ......... | 257/362 |
| 6,800,906 B2 * | 10/2004 | Cheng ..................... | 257/355 |
| 6,873,017 B2 | 3/2005 | Cai et al. ................ | 257/355 |
| 6,933,588 B1 | 8/2005 | Vashchenko et al. ..... | 257/565 |
| 7,067,852 B1 | 6/2006 | Vashchenko et al. ..... | 257/173 |
| 7,081,654 B2 | 7/2006 | Husher ................... | 257/355 |
| 7,145,187 B1 | 12/2006 | Vashchenko et al. ..... | 257/173 |
| 7,196,361 B1 | 3/2007 | Vashchenko et al. ..... | 257/173 |
| 7,202,114 B2 * | 4/2007 | Salcedo et al. .......... | 438/133 |
| 7,217,984 B2 | 5/2007 | Huang et al. ............ | 257/452 |
| 7,285,828 B2 * | 10/2007 | Salcedo et al. .......... | 257/357 |
| 7,323,752 B2 | 1/2008 | Chu et al. ............... | 257/360 |
| 2006/0289937 A1 * | 12/2006 | Li et al. .................. | 257/362 |
| 2007/0290266 A1 | 12/2007 | Ker et al. ................ | 257/355 |

OTHER PUBLICATIONS

Ker, Ming-Dou, "Overview of On-Chip Electrostatic Discharge Protection Design With SCR-Based Devices in CMOS Integrated Circuits," *IEEE, Transactions on Device and Materials Reliability*, vol. 5., No. 2, Jun. 2005, pp. 235-249.

* cited by examiner

*Primary Examiner*—George Fourson
(74) *Attorney, Agent, or Firm*—Sunstein Kann Murphy & Timbers LLP

(57) ABSTRACT

A high-voltage, low-leakage, bidirectional electrostatic discharge (ESD, or other electrical overstress) protection device includes a doped well disposed between the terminal regions and the substrate. The device includes an embedded diode for conducting current in one direction, and a transistor feedback circuit for conducting current in the other direction. Variations in the dimensions and doping of the doped well, as well as external passive reference via resistor connections, allow the circuit designer to flexibly adjust the operating characteristics of the device, such as trigger voltage and turn-on speed, to suit the required mixed-signal operating conditions.

20 Claims, 22 Drawing Sheets

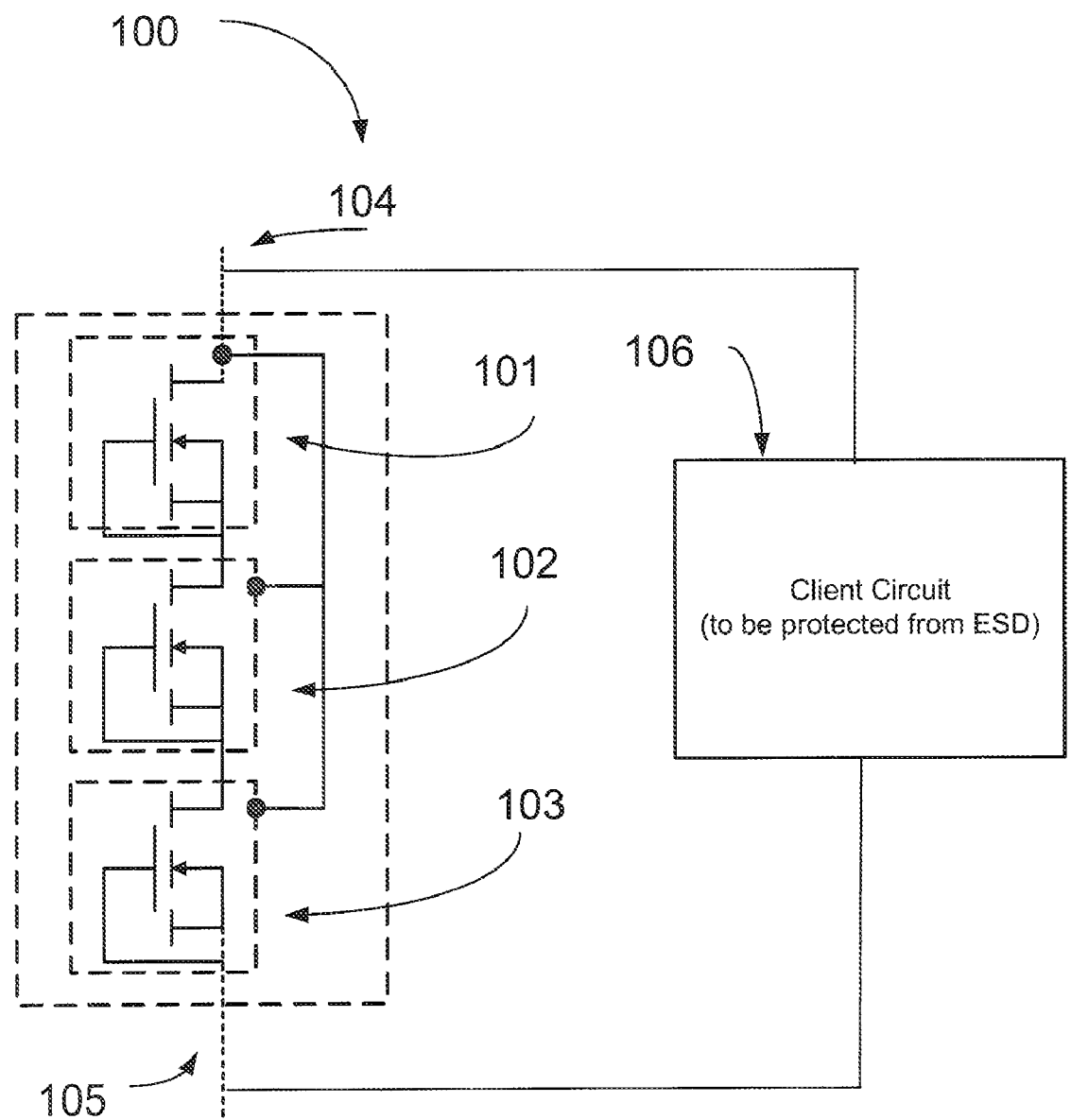
Fig. 1A – Prior Art

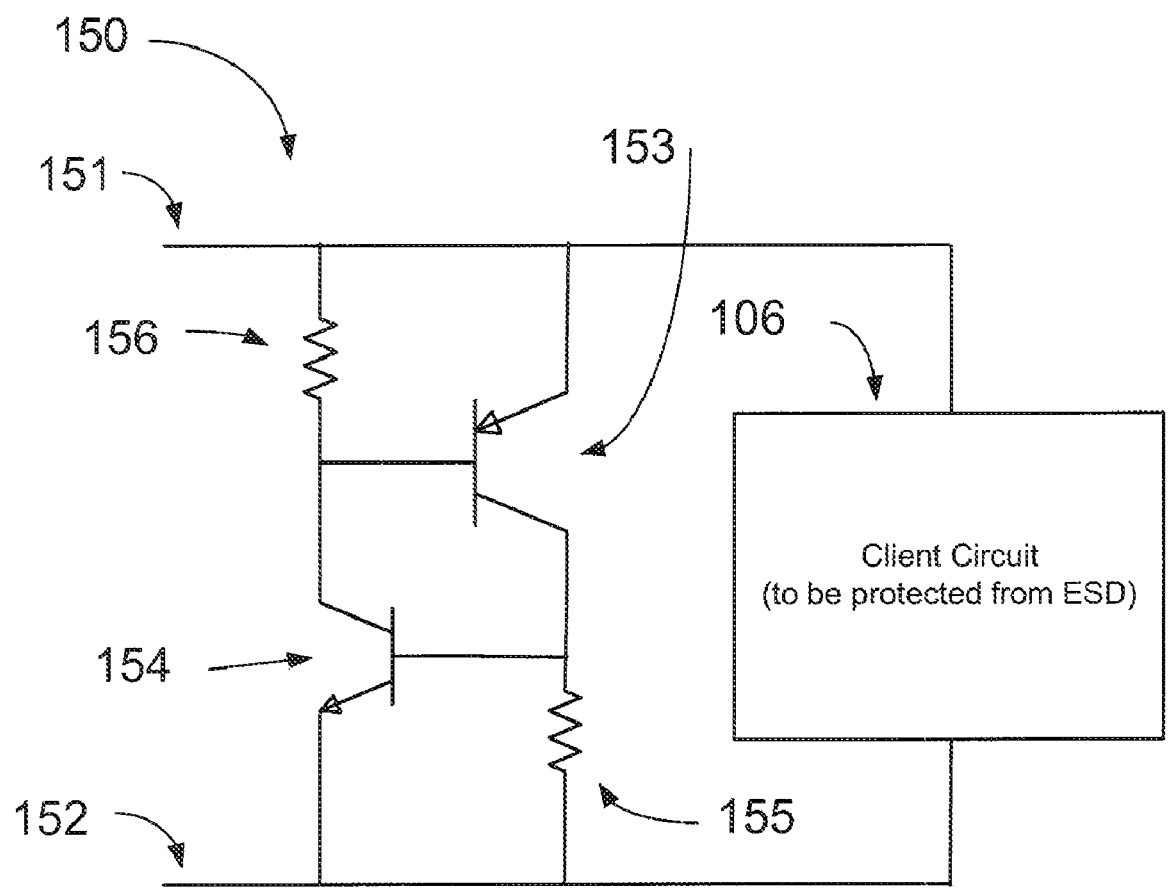
Fig. 1B – Prior Art

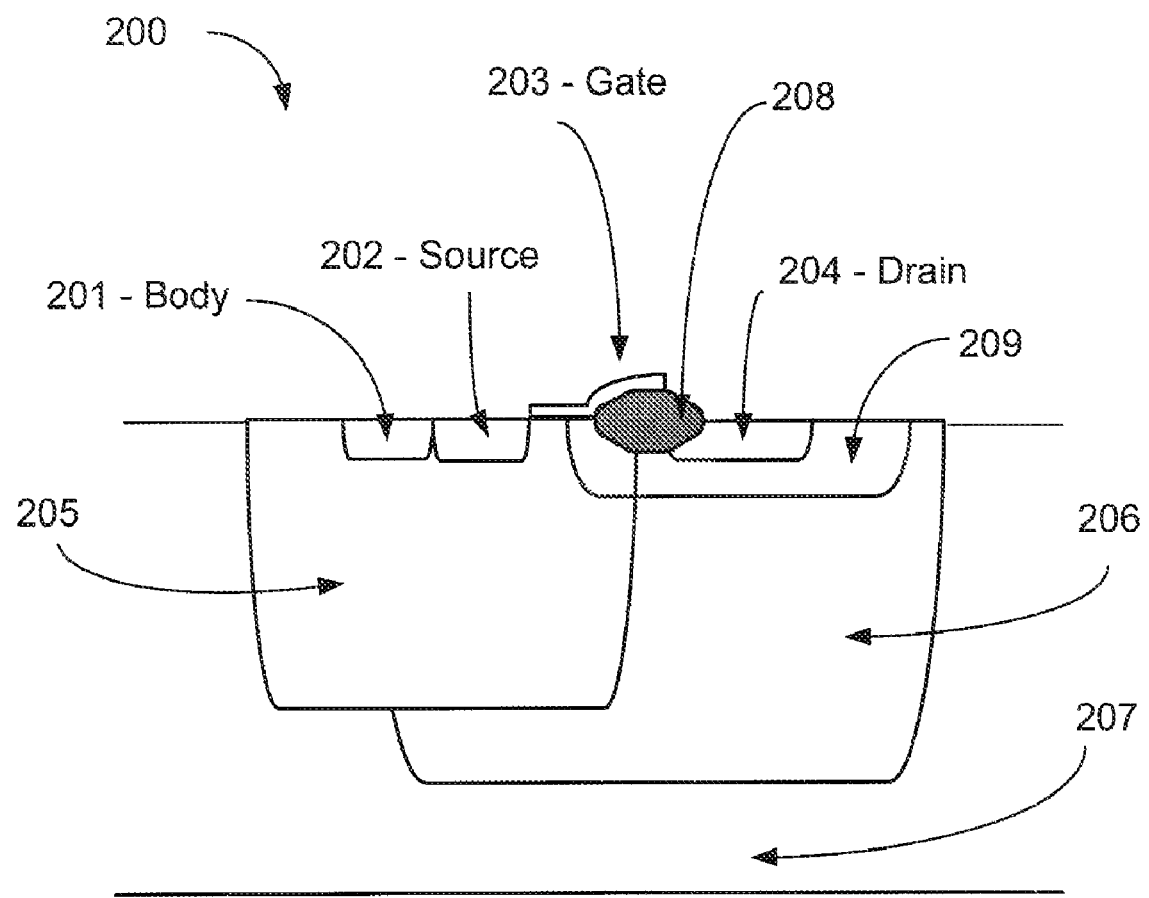
Fig. 2 – Prior Art

US 7,868,387 B2

LOW LEAKAGE PROTECTION DEVICE

FIELD OF THE INVENTION

The invention generally relates to a low-leakage current over-voltage protection devices, and more particularly, the invention relates to an over-voltage protection structure having an embedded doped region disposed between the terminal regions and a substrate.

BACKGROUND OF THE INVENTION

Electrostatic discharge ("ESD") and electrical overstress ("EOS") at the input/output ("I/O") pads of an integrated circuit can result in damage to the integrated circuit ("IC") leading to malfunction, processing errors, or even device destruction. ESD and EOS can be produced by load-inductive pulses, electromagnetic interference, or a charge imbalance between an I/O pad of an integrated circuit and an externally-grounded or pre-charged object.

Various devices and methods have been developed to protect an integrated circuit from the effects of ESD and EOS, as surveyed in "Overview of On-Chip Electrostatic Discharge Protection Design With SCR-Based Devices in CMOS Integrated Circuits" by Min-Dou Ker and Kuo-Chun Hsu, IEEE Transactions on Device and Materials Reliability, Vol. 5, No. 2, June 2005. Some approaches use silicon controlled rectifiers, or a stack of isolated, low-voltage devices, to provide a current path between a node to be protected and a power supply or ground pin. However, ESD/EOS protection for high-voltage/mixed-signal/multiple-power-domains remains difficult due to the larger power requirements of the circuits, narrow design windows, thermal limits, low leakage current requirements, and the need to avoid destructive snapback conditions. Design tradeoffs may increase fabrication cost (for example, due to the size of the devices or complexity of their fabrication) and thereby limit their application. If bidirectional ESD/EOS protection is desired, the devices may need to be duplicated for each pin, or may otherwise grow in size and complexity. Alternately, the integrated circuit devices themselves (e.g., transistors) may be modified to have some inherent ability to withstand ESD or EOS, but at a cost in power performance, larger silicon area, and higher cost.

SUMMARY OF THE INVENTION

In accordance with one embodiment of the invention, a semiconductor device on a substrate includes terminal regions to conduct current in two directions. The device includes a doped region disposed between the terminals and the substrate. In illustrative embodiments, the doped region is lightly doped to be N-type, and extends upwardly from a P-type substrate to the terminal regions. In addition, it is positioned between the terminal regions. As such, the dimensions and doping of the doped region influence the operating characteristics of the device.

BRIEF DESCRIPTION OF THE DRAWINGS

The foregoing advantages of the invention will be appreciated more fully from the following further description thereof with reference to the accompanying drawings wherein:

FIG. 1A schematically shows a prior art ESD protection device.

FIG. 1B schematically shows another prior art ESD protection device.

FIG. 2 schematically shows a DMOS transistor that illustratively may benefit from protection against ESD.

FIGS. 5A-1, 5A-2 and 5A-3 show cross-sections of one embodiment of the present invention, as viewed from the top.

DESCRIPTION OF ILLUSTRATIVE EMBODIMENTS

Figure 3A:
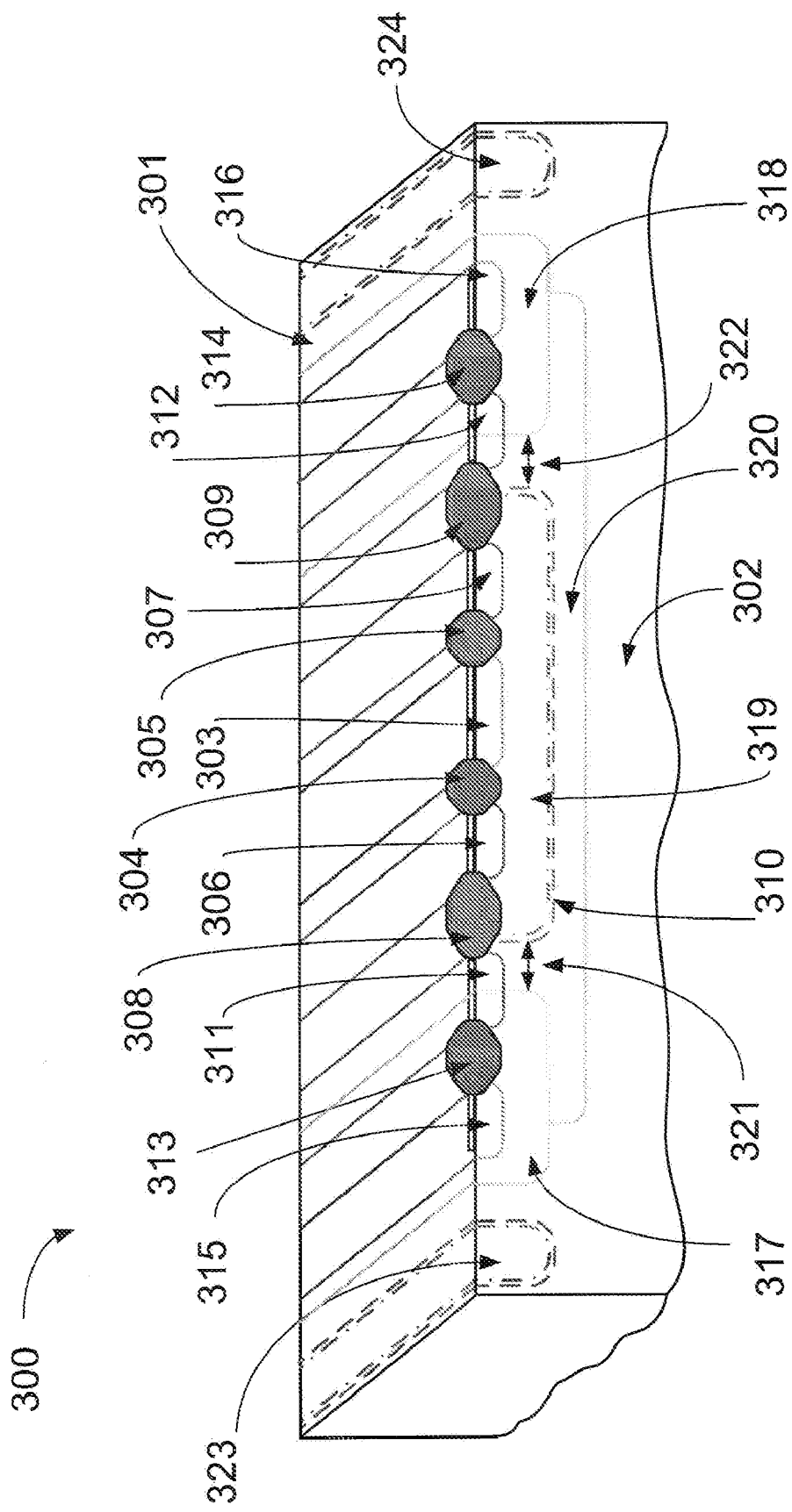
FIG. 3A schematically shows a cross-section of a protection device according to one embodiment of the present invention.

In illustrative embodiments of the invention, a low leakage current semiconductor device provides bidirectional protection from voltage stresses, such as electrostatic discharge ("ESD") or other electrical overstress.

A prior art device 100 for providing ESD protection is shown in FIG. 1A. Device 100 includes three low-voltage protection devices, 101, 102 and 103, connected between terminals 104 and 105. Each of the three devices 101, 102 and 103, is electrically connected to the terminal 104 to be protected. The terminal 104 is also connected to a client circuit 106 to be protected from ESD or other undesirably high voltage, so that the device 100 is electrically parallel to the client circuit 106. In operation, when the voltage at terminal 104 is less than a predetermined threshold voltage, device 100 is effectively open-circuit and presents an (ideally) infinite load in parallel with the client circuit 106. However, when the voltage at terminal 104 exceeds a predetermined threshold voltage, the device 100 will present a relatively low resistance path and conduct current from terminal 104 to terminal 105, thus reducing the voltage at terminal 104. The performance of device 100 can be determined by using more or fewer protection devices. However, structures of this type tend to have undesirably slow response times.

Another prior art device 150, commonly known as a silicon controlled rectifier (or "SCR") is schematically illustrated in FIG. 1B. The operation of an SCR is more fully described in the above-mentioned publication entitled "Overview of On-Chip Electrostatic Discharge Protection Design With SCR-Based Devices in CMOS Integrated Circuits" by Min-Dou Ker and Kuo-Chun Hsu, IEEE Transactions on Device and Materials Reliability, Vol. 5, No. 2, June 2005. Device 150 includes an anode 151 and a cathode 152, and is connected in parallel with client circuit 106, which is to be protected from electrostatic discharge. Device 150 has a PNP bipolar junction transistor 153 and one NPN bipolar junction transistor 154.

When the voltage difference between the anode 151 and the cathode 152 is less than the breakdown voltage of the N-P junction at the collector of the transistor 154, little leakage current will flow through the device 150 from the anode 151 to the cathode 152. However, when the voltage difference between the anode 151 and the cathode 152 exceeds the breakdown voltage of the N-P junction at the collector of transistor 154 (which voltage may be known as the "trigger" voltage), transistor 154 will begin to conduct. The collector of transistor 154 will draw current from the base of transistor 153, so that transistor 153 will also begin to conduct. Transistor 153, in turn, provides current to the base of transistor 154, driving transistor 154 further into conducting mode. Thus, once triggered, the two transistors 153 and 154 are in a positive-feedback relationship that will be maintained as long as anode 151 can supply current. Ideally, device 150 thereby presents an infinite resistance in parallel with client circuit 106 until the trigger voltage is reached, but thereafter present a low resistance path and acts to conduct current between it anode 151 and cathode 152 to protect client circuit 106 from a high-voltage event (such as an electrostatic discharge).

Figures 1, 5A:
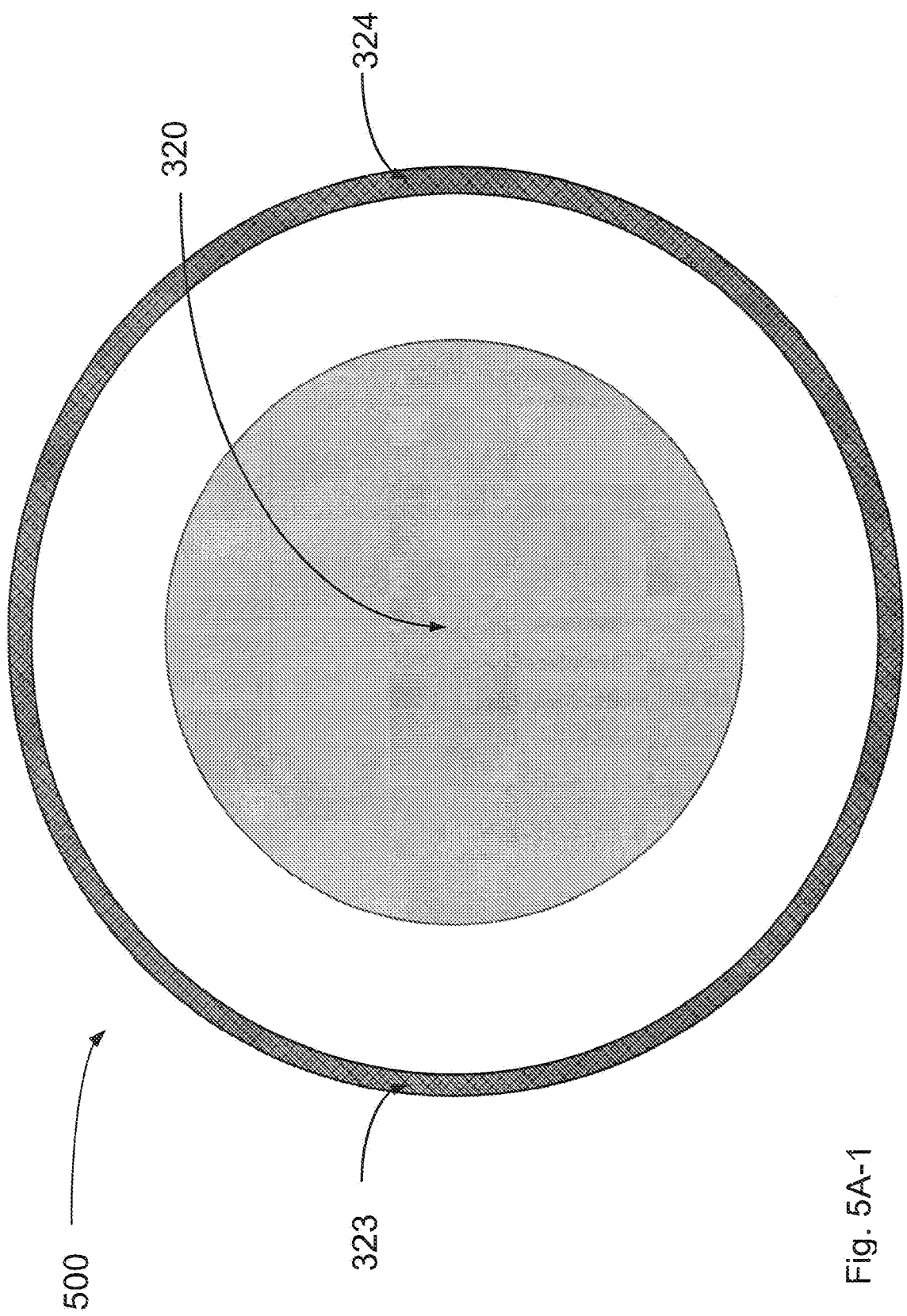
Figures 2, 5A:
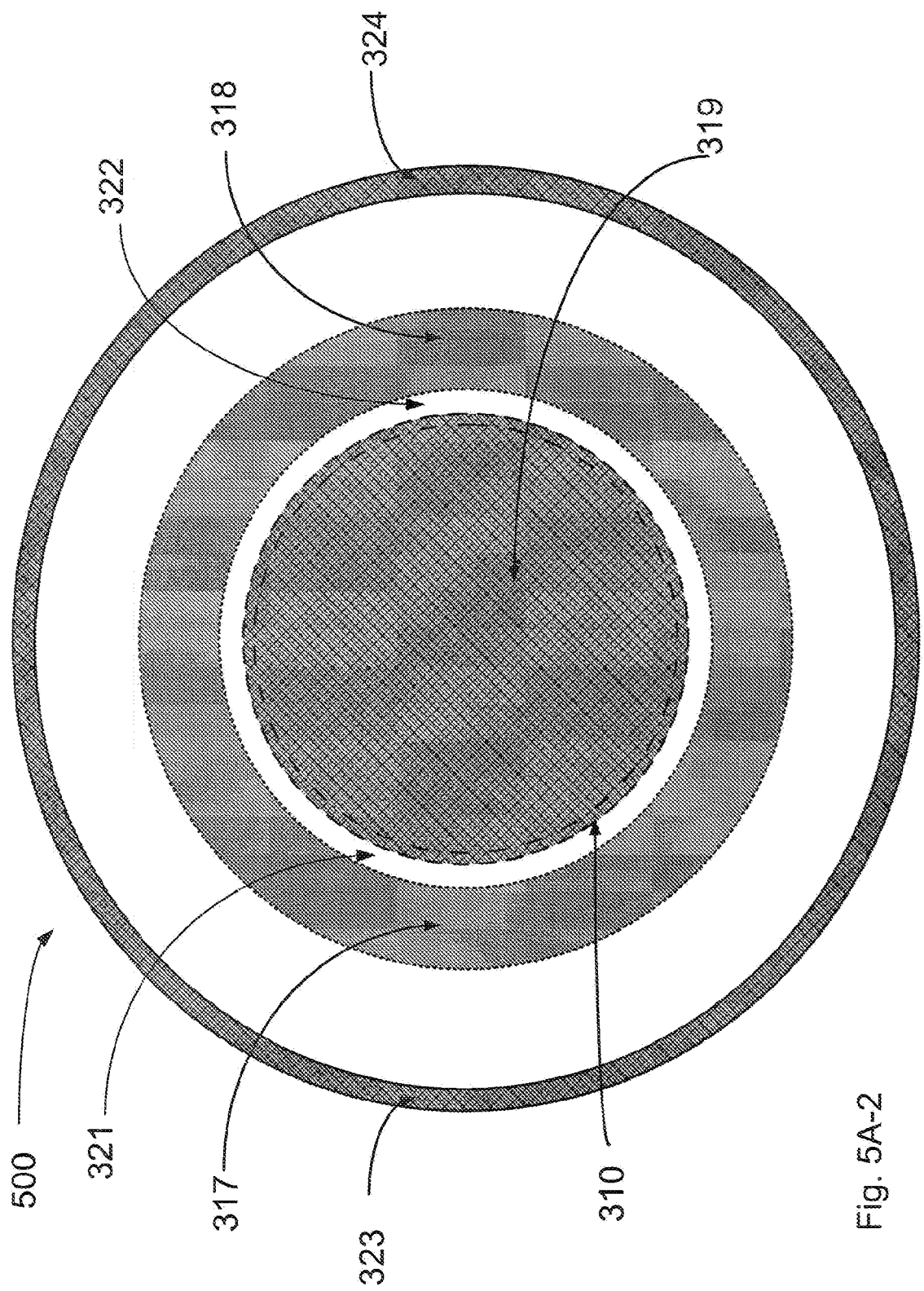

A device that may benefit from ESD protection is an n-type DMOS device as illustrated in FIG. 2, which extends the high voltage capability of low voltage mixed-signal CMOS processes. A DMOS device typically has diffusion layers of varying doping concentrations and varying depths deep into the substrate. The processes used to fabricate a DMOS device are thus capable of implanting varying concentrations of dopants deep into the substrate.

In the example of FIG. 2, the n-type DMOS device 200 is fabricated on a P-type substrate 207. Device 200 also includes a heavily-doped P-type body terminal 201 adjacent to a heavily-doped N-type source terminal 202. Body terminal 201 and source terminal 202 both reside in a deep, more lightly-doped P-type well 205. Adjacent to source 202 is a polysilicon gate 203 that covers one edge of P-type well 205 and part of insulator 208. Adjacent to insulator 208 is a heavily-doped N-type drain terminal 204. Drain terminal 204 resides in N-type well 209, which also underlies insulator 208 and intersects part of deep P-type well 205. Finally, deep and lightly-doped N-type well 206 underlies all of N-type well 209 (including drain 204 and insulator 208), and part of deep P-type well 205. A DMOS device, such as device 200, has some ability to withstand electrostatic discharge, and that ability can be modified as a function of device dimensions. However, enlarging DMOS devices reduces the device density on the integrated circuit, reduces the speed of the devices, and increases the time it takes to respond to an ESD event.

A vertical cross-section of a protection device according to an illustrative embodiment of the present invention is schematically shown in FIG. 3A. The figure shows an illustrative portion of the top surface 301 of the device (to lend perspective). Note that in the figures herein, not all features are necessarily drawn to scale.

The device 300 is fabricated on a semiconductor wafer having a top surface 301, and a P-type substrate 302. At the center of the device 300 is a heavily doped N-type terminal 303. Generally, in cross-section, the device 300 is symmetrical about terminal 303, and so the following description will describe the device features moving from the center (the terminal 303) towards the left side of FIG. 3A (with occasional reference to corresponding features in the right side of FIG. 3A).

To the left of the terminal 303 is an insulator 304 (with corresponding insulator 305 mirrored on the right side of FIG. 3A). To the left of the insulator 304 is a heavily-doped P-type terminal 306 (with corresponding terminal 307 on the right side of FIG. 3A). The insulator 304 extends in-between terminal 303 and 306, although the insulator 304 is only illustrated at the front of the cross-section in FIG. 3A. Other insulators described below also extend along the lengths of the features that they separate.

To the immediate left of the terminal 306 is an insulator 308 (with corresponding insulator 309 on the right side of FIG. 3A). In some embodiments (not shown), the terminal 303 could be P-type, and the terminals 306 and 307 could be N-type, but in illustrative embodiments, the terminal 303 is N-type, while the terminals 306 and 307 are P-type.

Together, the terminals 303, 306 and 307 may be electrically connected together to form one port 325 (schematically illustrated in FIG. 3B) of the device 300. Further, the terminals 303, 306 and 307 are fabricated in a P-type well 319, and extends from the insulator 308 to the insulator 309. The well 319 is bounded by P-type layer 310. The interface between the well 319 and the terminal 306 will create a resistance due to the different doping concentrations (with a corresponding resistance between the well 319 and the terminal 307). This resistance will impact the performance of the device 300. The interface between the well 319 and the terminal 303 will form a P-N junction that will also play a part in the performance of the device 300.

Figure 3B:
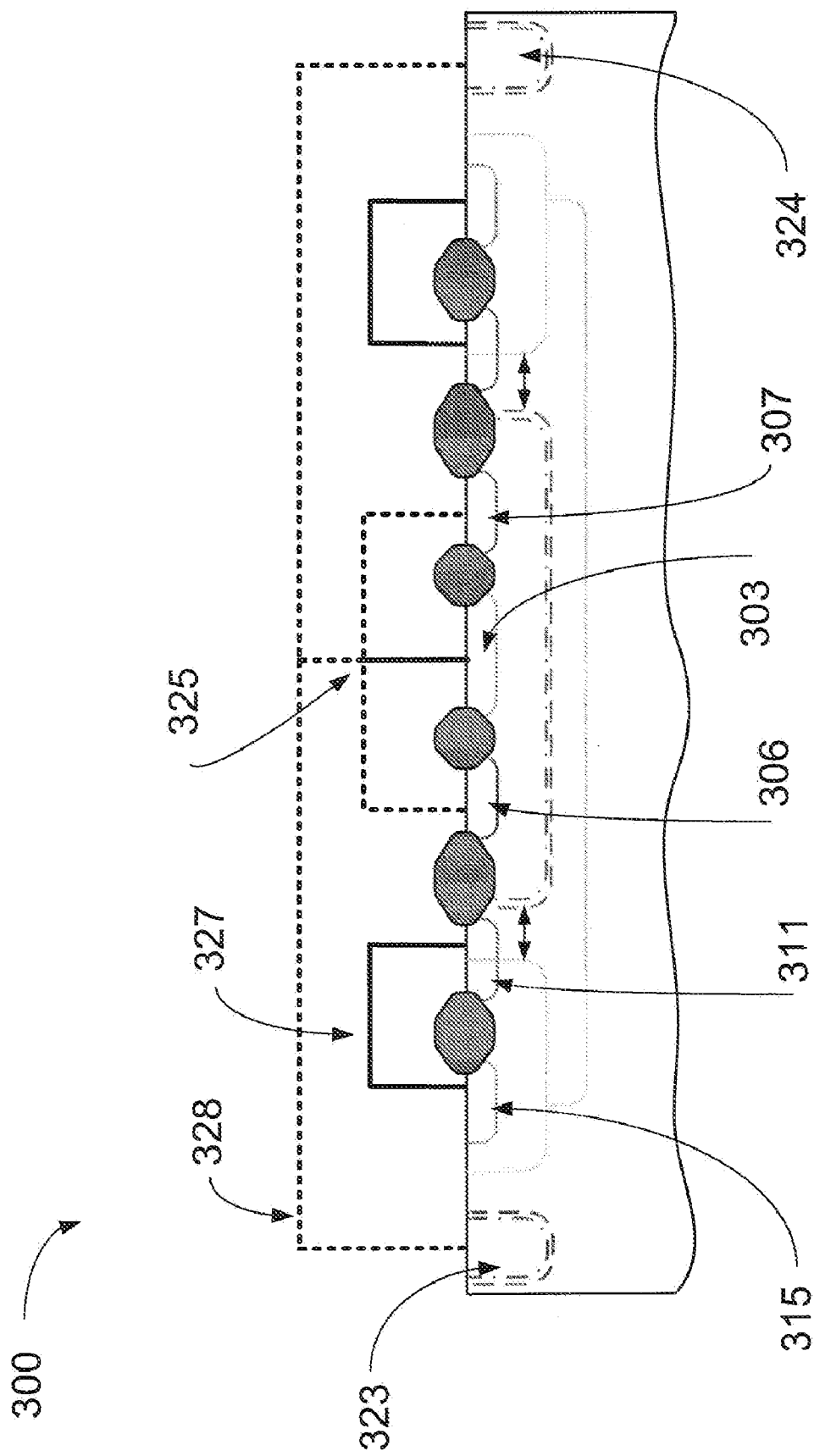
FIG. 3B schematically shows illustrative surface interconnections among the various features of the device of FIG. 3A.

Proceeding leftwards, adjacent to the insulator 308 is heavily-doped P-type terminal 311 (with corresponding terminal 312 on the right side of FIG. 3A). Another insulator 313 separates the terminal 311 from the heavily-doped N-type terminal 315. On the right side of FIG. 3A, insulator 314 separates the terminal 312 from the heavily-doped N-type terminal 316. The terminals 311 and 315 may be electrically connected together to form a second port 327 (FIG. 3B) of device 300. On the right side of FIG. 3A, the terminals 312 and 316 may be electrically connected together to form a separate terminal 328 (FIG. 3B).

The terminal 315 and the insulator 313 are fabricated in an N-type well 317 that is deeper than the terminal 315 and the insulator 313. Terminal 311 sits partially within the well 317.

A corresponding well 318 is fabricated on the right side of FIG. 3A. A resistance will be inherent at the interface of the well 317 and the well 320, and also and the interface of the well 318 and the well 320.

A layer of N-type silicon forms well 320 that underlies all of the well 319, and part of the wells 317 and 318, including the terminals 311 and 312, and the gaps 321 and 322 between the well 319 and wells 317 and 318, respectively. Fabricating the well 320 may employ the process capabilities already used for DMOS fabrication, so fabricating ESD-protection devices according to some embodiments of the present invention may be done without new or additional process steps. The doping of N well 320 may be uniform, or not uniform, throughout. Note that in the area of well 317 there are three regions of similar conductivity type (in the embodiment of FIG. 3A, the conductivity type is N-type), and each region has unique doping concentrations.

As will be further discussed below, the dimensions of the gaps 321 and 322 impact the performance of the device 300. At this point, it can be seen that the terminal 303, the well 319, and the well 320 form an NPN bipolar junction transistor 401 (see FIG. 4). Similarly, the terminal 311 forms a PNP bipolar junction transistor 403 along with the well 317, the well 320, and the well 319.

Finally, at the edge of the device 300 is a heavily-doped P-type well 323 (with corresponding well 324 on the right side of FIG. 3A). The wells 323 and 324 serve to isolate the device 300 from the rest of the integrated circuit or wafer. A resistance is be inherent at the interfaces between the wells 323 and 324, and the substrate 302. Likewise, the interface of well 302 and 320 forms a P-N junction that acts as a diode 406 to discharge ESD current in some situations.

Figure 4:
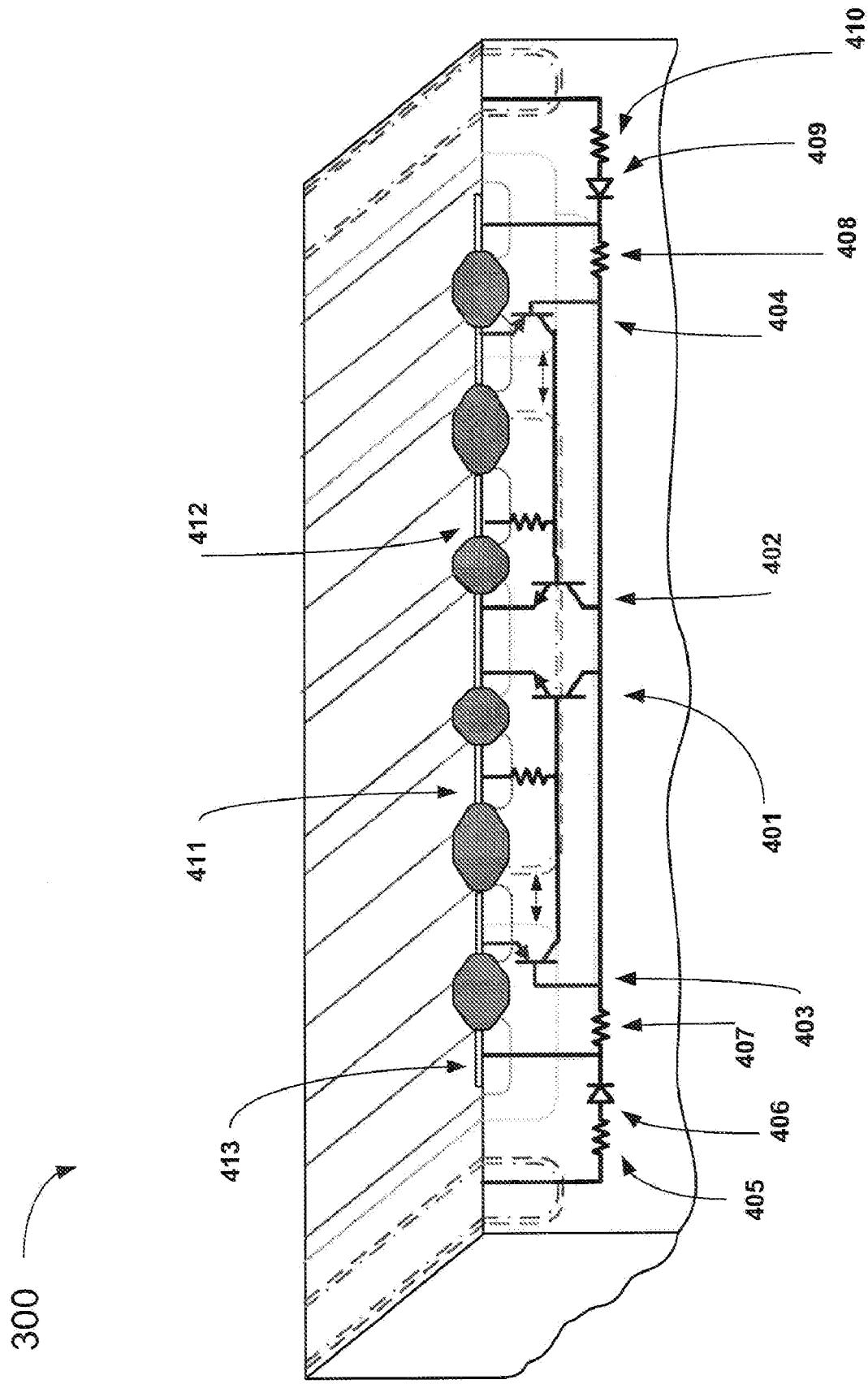
FIG. 4 schematically shows a device according to another embodiment of the present invention, overlaid with a schematic circuit diagram.

The terminals 303, 306, 307, 311, 312, 315 and 316 may include a contact on the surface 301 to permit electrical interconnections. Similarly the well 323 and the well 324 may include a contact on the surface 301 to permit electrical interconnections. An illustrative contact 413 is illustrated in FIG. 4.

The various terminals and wells described above include several interfaces that form P-N and N-P junctions, as well as several transistors and resistors. Together, these features form various circuits within the device 300, as will be described below. Further, the operating characteristics of the device 300 will depend, in part, on the doping concentrations of the various regions. In preferred embodiments, the doping concentrations are given in Table I, in which alternatives are presented for the doping and physical dimensions of some structures. The alternatives for various embodiments shown in Table I are not an exhaustive list of alternatives, and do not limit the present invention. In Table I, the depth of some features is listed as "N/A" where a feature of one conductivity type (for example P-type) is being fabricated in a well of the same conductivity type, so that a distinct boundary may not be formed. However, features are substantially formed within the bounds of the well in which they are formed.

The device 300 of FIG. 3A is shown with a schematic diagram of a circuit in FIG. 4, and will be explained in two different modes of operation. In one embodiment, the terminals 303, 306 and 307 are electrically connected together to form one port 325 (illustrated in FIG. 3B), and the terminals 311 and 315 are electrically connected together to form a second port 327 (illustrated in FIG. 3B; a similar connection could be made between terminals 312 and 316). In some embodiments, the terminals 306 and 307 may be left floating, as indicated by the dashed lines connecting them in FIG. 3B. Because the device in this embodiment is symmetric about the terminal 303, the operation of only the left-half of the device 300 will be discussed, with the understanding that the same discussion would explain the operation of the right-half of the device 300. In one embodiment, the port 325 would be connected to ground, while the port 327 would be connected to a power supply or incoming signal. Some embodiments may not be symmetric about a point; for example, one embodiment may consist of features similar to those on only the left half of the embodiment in FIG. 3A.

In the first mode, an external source (such as an ESD event) causes the voltage at port 325 to exceed the voltage at port 327. The device 300 should react quickly to protect the client circuit (not shown) before the voltage exceeds a safe limit (as determined by the circuit designer). In this mode, the device includes a forward-biased P-N junction (the collector-base junction of PNP transistor 403), where the P-type anode is formed by terminal 306 and well 319, and the N-type cathode is formed by well 320, well 317, and terminal 315. The operating characteristics of this diode will depend on the doping concentrations of the various regions, as well as their physical dimensions. As a forward-biased P-N junction, the device 300 allows the ESD stress to discharge to a power supply or to ground connected to port 327.

In an alternate embodiment, port 325 is electrically connected to well 323 (indicated by dashed line 328 in FIG. 3B), thus creating a second forward-biased P-N junction illustrated in FIG. 4 as diode 406, where the P-type anode is formed by well 323 and substrate 302, and the N-type cathode is formed by well 320, well 317, and terminal 315. Resistors 405 and 407 are inherent at the interface well 320 and well 317, and the interface of well 323 and substrate 302. Diode 406 may conduct current to discharge the ESD potential either alone (for example, if terminal 306 is floating), or in conjunction with the forward-biased P-N junction (part of transistor 403) discussed above.

In the second mode, an external source (such as an ESD event) causes the voltage at port 327 to exceed the voltage at port 325 (for example, the operating voltage). Once again, the device 300 must react to protect the client circuit (not shown). As this voltage difference increases, the P-N junction formed by well 319 and well 320 is reverse-biased, so very little leakage current flows through the junction and the voltage difference is allowed to rise. However, at a threshold (or "trigger") voltage, that P-N junction will break down, and current begins to flow. The trigger voltage must be determined and established by the design engineer at a point where it is low enough to trigger the device 300 before the voltage has reached a point where the client circuit (not shown) will be damaged, but high enough that the device 300 will not trigger within the normal operating voltage of the client circuit.

This threshold can be determined based on the dimensions of certain features of the device 300, as well as the doping concentrations of the various regions of the device 300. Specifically, spaces 321 and 322, and the doping of well 320, can be adjusted to control the trigger voltage. In some embodiments, the spaces 321 and 322 can be adjusted from near zero distance, up to at least 3 micrometers. Increasing the length of spaces 321 and 322 allows the space charge region between well 319 and wells 317 and 318, respectively, to extend, thereby increasing the breakdown voltage of the junction. Expressed alternately, increasing the length of spaces 321 and 322 raises the trigger voltage of the device. In other embodiments, the depth of the well 319 can be made shallower and the width of layer 310 can be made wider to adjust the triggering voltage of the device 300. Alternately, the deeper implant layer 310 can be omitted to reduce the trigger voltage.

When the trigger voltage has been reached, the circuit of device 300 changes from a reverse-biased diode dominated structure, to a two-transistor circuit to conduct current from terminal 311 to terminal 303. Effectively, the device becomes a regenerative bipolar feedback device, similar to the SCR as described above and illustrated in FIG. 1B. Terminal 303 injects electrons (majority carriers) into well 319 as part of the regenerative feedback, which allows for high conductivity modulation and current discharge capability in the device 300. Also in this mode of operation, terminal 311 injects a high density of holes (its majority carrier) into the P-N junction of transistor 403 to facilitate the conductivity of transistor 403. As such, the impedance of the device appearing between terminals 327 and 325 changes from a high impedance to a low impedance, allowing the current to flow and the potential difference between terminals 327 and 325 to dissipate. Transistors 401 and 403 are locked into a positive-feedback (or regenerative feedback) circuit, and continue to conduct until the ESD has been dissipated.

As indicated above, resistor 411 is inherent at the junction of terminal 306 and well 319. When terminal 306 is electrically connected to terminal 303 (for example, by a line on the surface 301 of device 300, a short circuit), resistor 411 will conduct current so that the voltage across resistor 411 is equal to the base-emitter voltage of NPN transistor 401, with the effect that the rise of the base-emitter voltage of transistor 401 is moderated.

However, in some embodiments, terminal 306 may be left floating (i.e., open-circuit). In that case, resistor 411 will not conduct current, and the base-emitter voltage of transistor 401 will rise more rapidly since no charge is being siphoned away by resistor 411. This effect can be utilized to adjust the response time of device 300.

In an alternate embodiment, an external resistor (not shown) connected between terminal 306 and terminal 303 can be used to modify the trigger condition. In such an embodiment, the impedance between terminal 303 and terminal 306 is greater than the impedance of a short circuit embodiment, and less than the infinite impedance of an open-circuit embodiment. Increasing the impedance between these nodes will reduce the trigger voltage due to the amplification of thermally generated current in the embedded bipolar transistor.

Figure 3C:
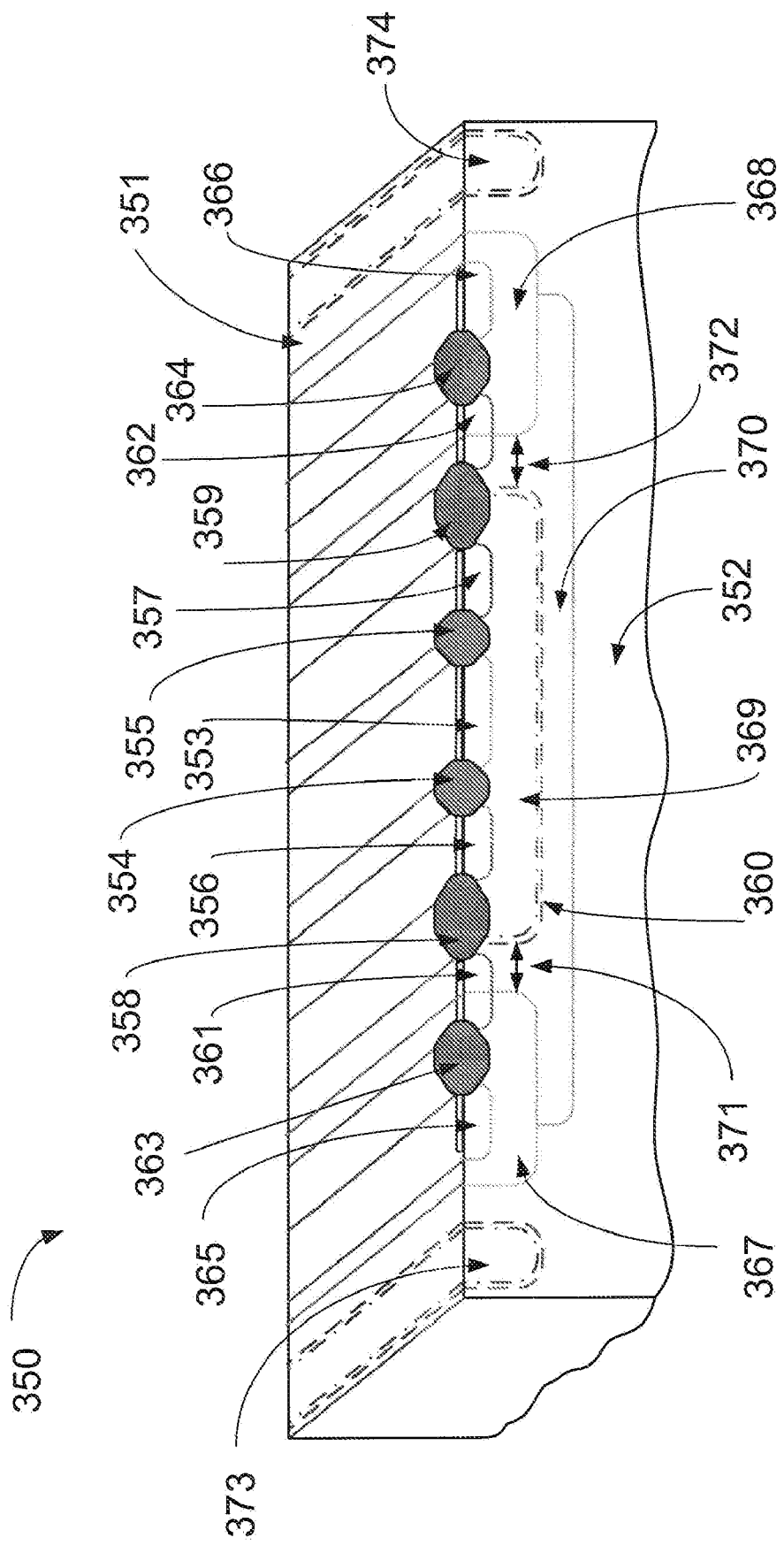
FIG. 3C schematically shows a cross-section of a protection device according to another embodiment of the present invention.

An alternate embodiment of the present invention is illustrated in FIG. 3C, which is essentially the complement of the embodiment in FIG. 3A. The embodiment in FIG. 3C includes an N-type substrate 352, with a top surface 351, as well as insulators 354, 355, 358, 359, 363 and 364; N-type terminals 356, 357, 361 and 362, and P-type terminals 353, 365, and 366. The embodiment in FIG. 3C also includes N-type well 369 an N-type layer 360; N-type isolation regions 373 and 374, and P-type wells 367 and 368, as well as deeper P-type well 370. The embodiment in FIG. 3C also includes gaps 371 and 372. The embodiment illustrated in FIG. 3C produces circuits that are complementary to those described in connection with the embodiment illustrated in FIG. 3A. In some embodiments (not shown), the terminal 353 could be N-type, and the terminals 356 and 357 could be P-type.

Although there are a broad variety of embodiments of the present invention, the embodiment of FIG. 3A will be the primary embodiment discussed for illustrative purposes herein. Accordingly, such illustrations do not limit the scope of this invention.

Several cross-sections of a circular embodiment 500 of the present invention are shown in FIG. 5A-1, FIG. 5A-2 and FIG. 5A-3. Each of the cross-sections is from a top-view perspective, looking down at an illustrative embodiment, and each represents a different depth from the surface of the device. Except as otherwise noted, N-doped regions are shown as solid, shaded features, P-doped regions are illustrated as cross-hatched, shaded features, and insulator regions are shown as cross-hatched, shaded regions. Although the embodiment shown in FIGS. 5A-1, 5A-2 and 5A-3 is not necessarily the same as the embodiment illustrated in FIG. 3A, some similar features have been illustrated with common reference numbers. Reference to device 300, and features of device 300, in connection with other figures is for illustration only, and not intended to limit the scope of all embodiments of the present invention, or the ways in which various embodiments of the present invention may be applied.

The cross-section in FIG. 5A-1 is within the substrate, below N wells 317 and 318, and below P wells 319 and 310. At the center is the deep N well 320, illustrated as a solid, shaded region. Around the periphery is an annular P well, which corresponds to P wells 323 and 324 in FIG. 3A. In other words, P wells 323 and 324 in FIG. 3A are both parts of a single annular ring, as illustrated in FIG. 5A-1. This is also true of the several other generally concentric features of this illustrative embodiment. Such features may be identified in these figures with both corresponding numbers from FIG. 3A. In some embodiments, the annular P well (323 and 324) may not be as deep as the deep N well 320 (and therefore may not ordinarily appear in a cross-section at this depth in the substrate), but is shown as a point of reference to facilitate comparison with FIG. 5A-2 and FIG. 5A-3. Although the features are described as being annular, and concentric, the embodiments of the present invention are not limited to annular rings, or features having common centers. Some embodiments may include features that circumscribe other features, although the circumscribing features may not be circular or annular, and may not share a common center point.

Figures 3, 5A:
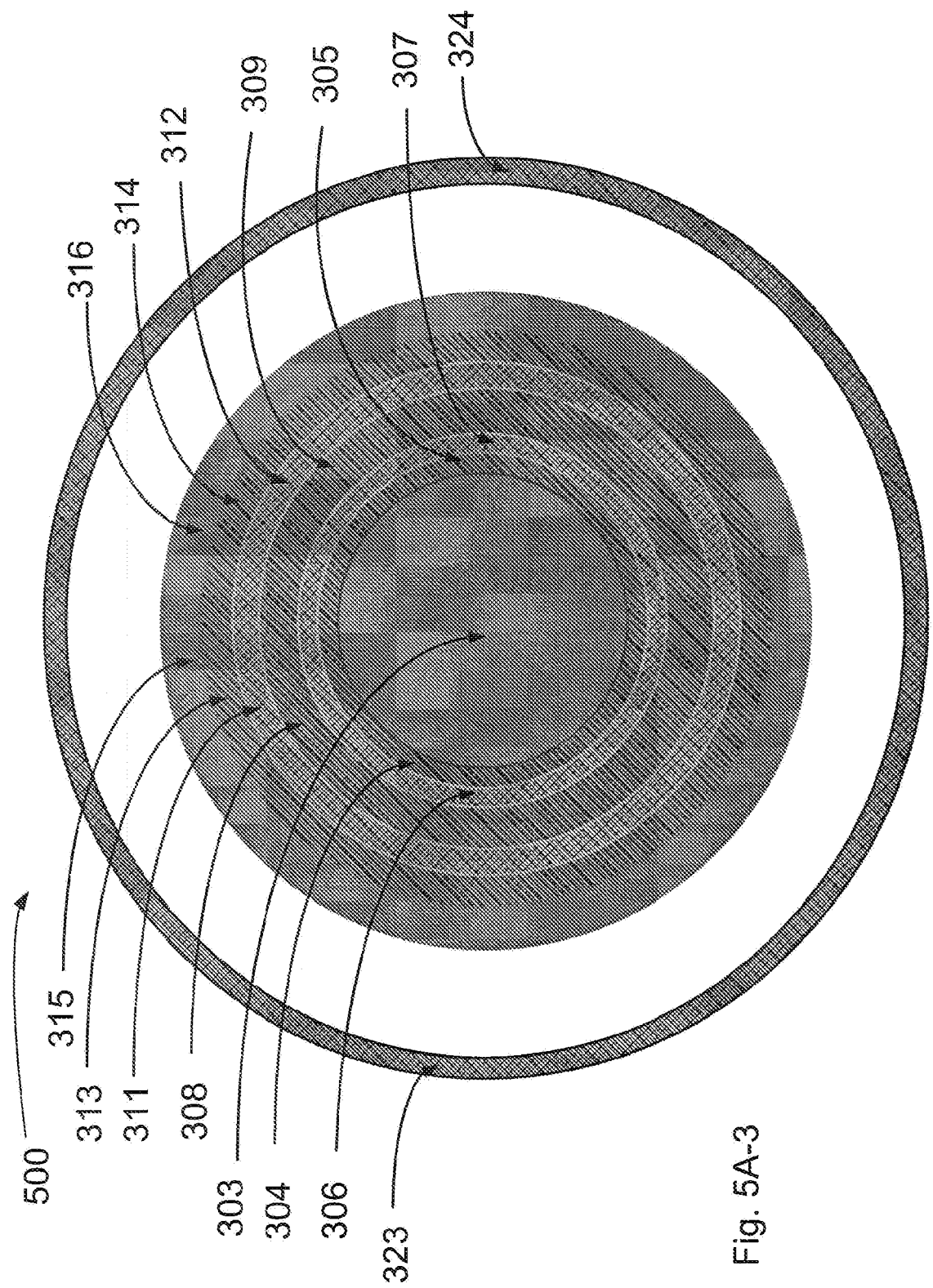

Another cross-section of the same illustrative embodiment 500 is shown in FIG. 5A-2, which illustrates a cross-section of the device at a depth above the cross-section of FIG. 5A-1, and below the surface features. P wells 319 and 310 are at the center of this cross-section, and are surrounded by an annular N region that forms both N wells 317 and 318. Between P well 310 and annular N well 317/318 is an annular space corresponding to gaps 321 and 322, illustrated without hatching or shading although it is N-doped as part of N well 320, as explained previously. Surrounding these features is the annular P well (323 and 324) that is also shown in FIG. 5A-1 and FIG. 5A-3. The annular region between the N well (317 and 318), and the outermost annular P well (323 and 324) is substrate 302.

A third cross-section of the same embodiment 500 is shown in FIG. 5A-3, which shows features at or near the surface of the illustrative device. At the center is N well 303, which is separated from an annular P well (306 and 307) by an annular insulator (304 and 305). Continuing outwardly from the center is an annular insulator (308 and 309), and then annular P well (311 and 312). Next are annular insulator (313 and 314), and annular N well (315 and 316). Finally, surrounding these features is the annular P well (323 and 324) that is also shown in FIG. 5A-1 and FIG. 5A-2.

Figure 5B:
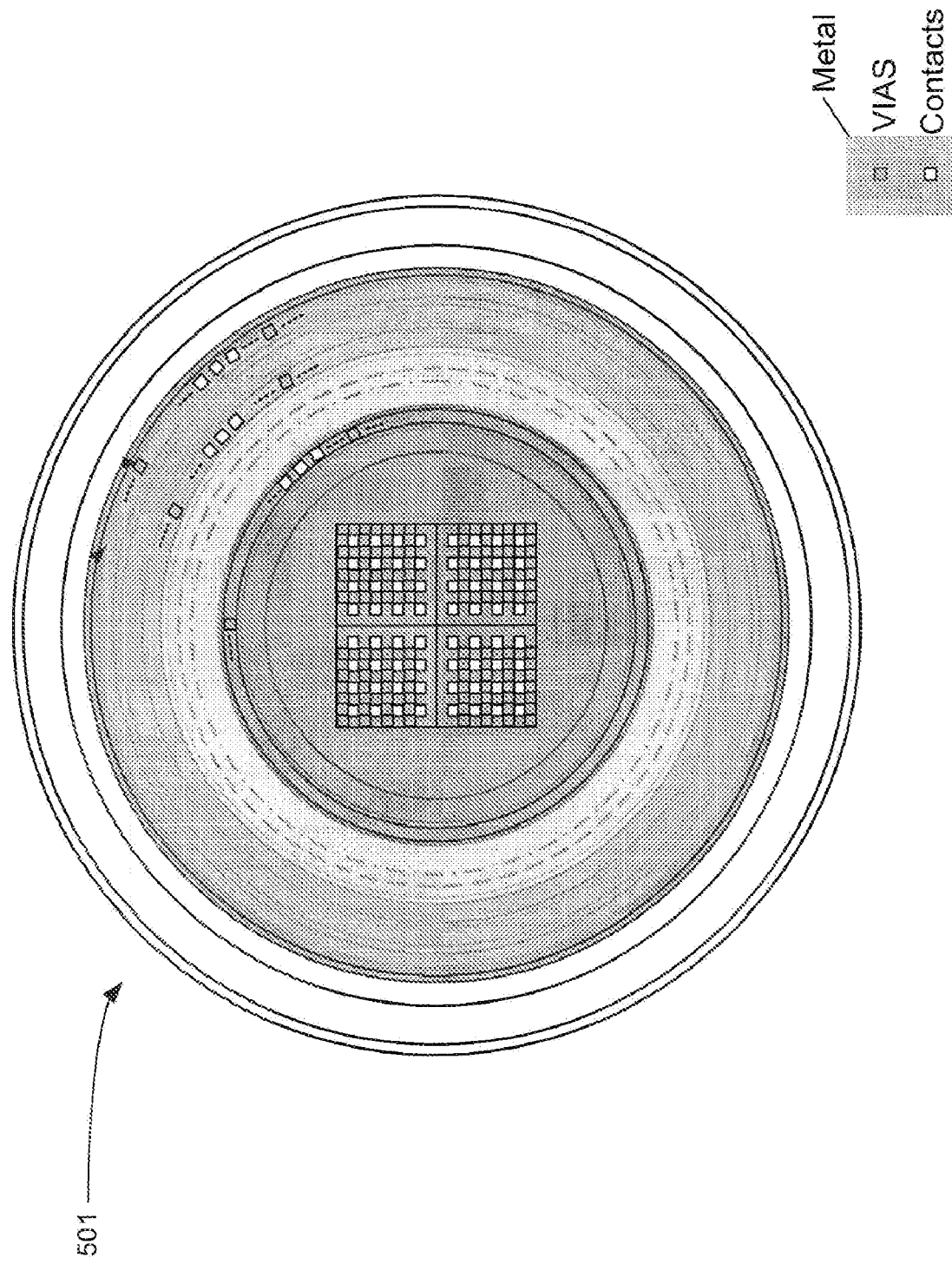
FIG. 5B schematically shows a plan view of the top surface of an ESD protection device according to an embodiment of the present invention.
Figure 5C:
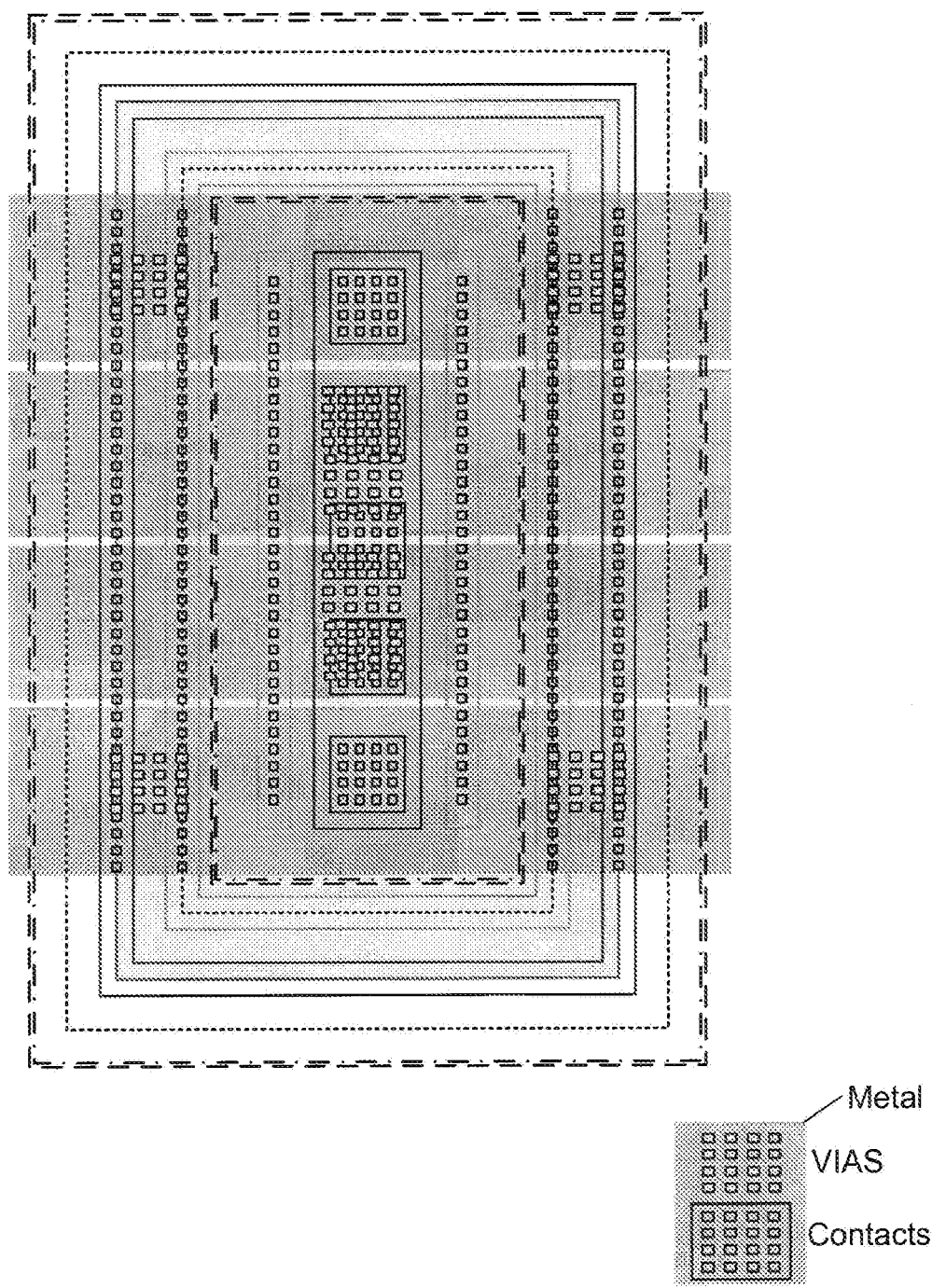
FIG. 5C schematically shows a plan view of the top surface of an ESD protection device according to another embodiment of the present invention.

When implemented in an integrated circuit, for example, some embodiments of this inventions may require metal interconnects at the surface, or in layers below the surface. In addition, connections to, or between, such metal layers may be required, such as with vias and contacts. These features may be created by means conventionally known in the art. In FIG. 5B, metal layers are illustrated as shaded regions, contacts are illustrated as small white squares, and vias are illustrated as small shaded squares. In FIG. 5C, vias and contacts are illustrated small squares, as indicated by the key in FIG. 5C.

A circular implementation 501 of an alternate embodiment of the present invention is schematically illustrated in FIG. 5B, and an alternate rectangular embodiment 502 of the present invention is schematically illustrated in FIG. 5C. Not all embodiments of the present invention are limited to circles and rectangles, however, because other shapes may be fabricated without departing from the principles of embodiments of the present invention. FIG. 5B and FIG. 5C show embodiments from a top view, and show features both at the surface, and boundaries within the substrate. As shown in FIG. 5A-3, some features of some embodiments of the present invention may be visible at the surface, and may form concentric rings about a center point. These rings may be circular, rectangular, or other shapes that will allow the features to be essentially concentric. This concentric design accounts for the symmetry of the device 300 around its center point as illustrated, for example, in FIG. 3A. The design also gives great flexibility to the integrated circuit designer to elect where and how to connect the client circuit to the ESD device. In some embodiments, a device may be part or all of a bond pad.

Figure 6:
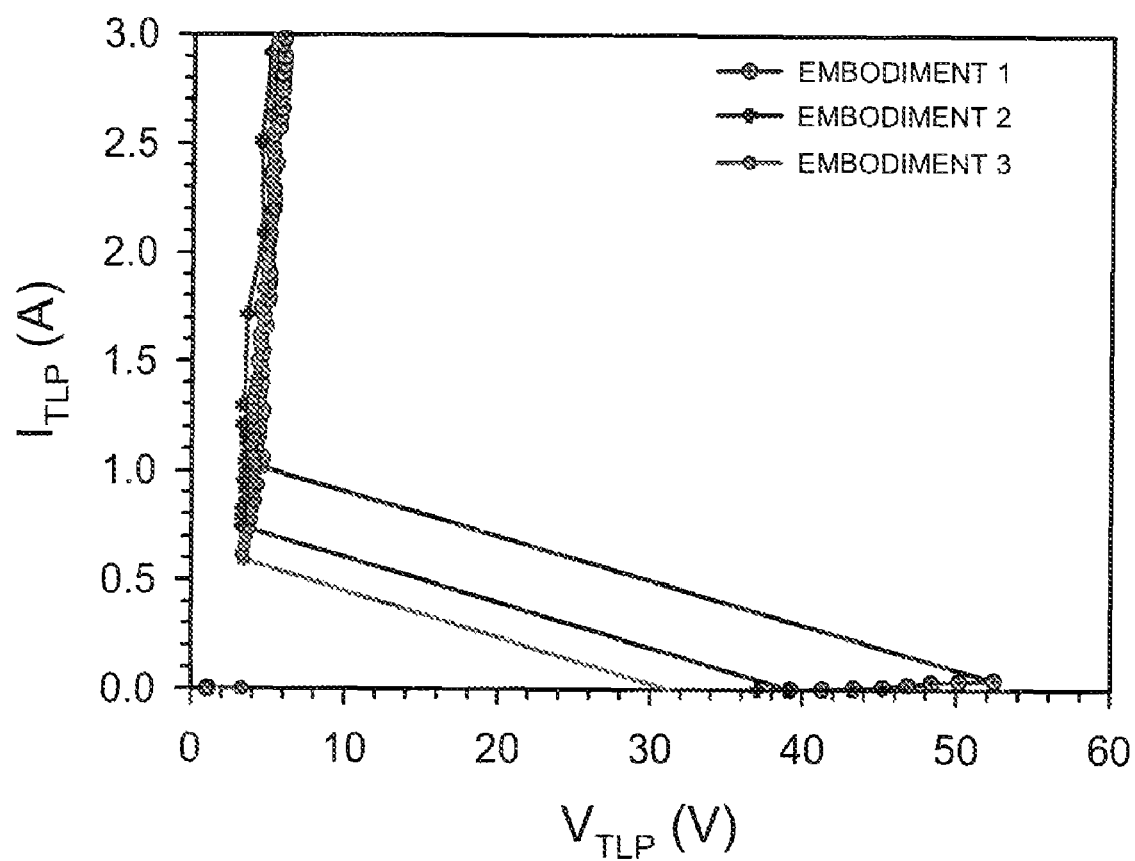
FIG. 6 shows a current-voltage transmission line pulsed ("TLP") plot according to an embodiment of the present invention.

A current-voltage plot illustrating the performance of several embodiments of the present invention is presented in FIG. 6, in which the horizontal axis represents voltage (in volts) of a transmission line pulse across the device 300, while the vertical axis represents the current (in amperes) through the device 300. In one embodiment ("Embodiment 3"), the voltage across the device can increase up to approximately 31 volts with little or no current flow through the device 300. If the client circuit can withstand a potential of greater than 31 volts on the terminals being protected, then such a voltage rise will not harm the client circuit. However, at a threshold voltage of approximately 31 volts in this example, snapback occurs and the device 300 begins to conduct substantial current, while holding the voltage across the device 300 at a level well below the tolerance of the client circuit. After snapback, the impedance of the device 300 remains low, so that current flow through the device 300 can reach several amperes, with very little increase in the terminal voltage. In this way, the client circuit is protected from the electrostatic discharge. Another embodiment ("Embodiment 2") has a trigger voltage at approximately 39 volts, while another embodiment ("Embodiment 1") has a trigger voltage over 50 volts. FIG. 6 illustrates that the performance characteristics of embodiments of the present invention can be adapted to meet the requirements of a variety of applications.

Figure 7A:
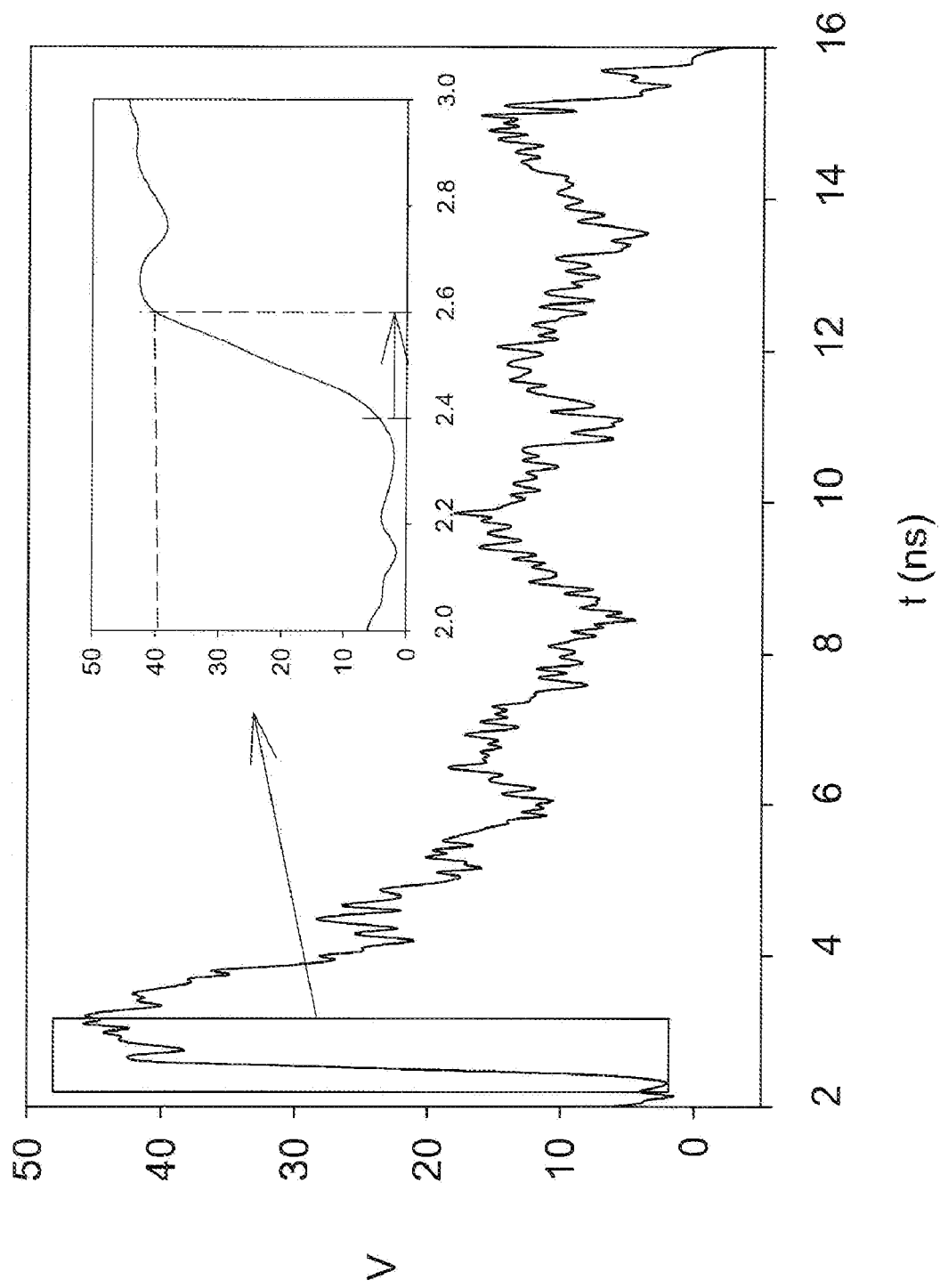
FIG. 7A shows an illustrative transient response time for an embodiment of the present invention.

A plot of illustrative response time for one embodiment of the present invention is presented in FIG. 7A, which shows a transmission line transient waveform applied to an embodiment of the present invention. The voltage transient rises to approximately 45 volts over a time of approximately 2 nanoseconds. Specifically, a substantial portion of the voltage pulse's rise occurs over a time of approximately 200 picoseconds, as illustrated in the magnified depiction of the pulse in the upper right-hand corner of FIG. 7A. After the voltage impulse reaches the trigger voltage, the device 300 activates with the result that the voltage drops rapidly to, and is held below, a voltage below the trigger voltage, even as current flow increases.

Figure 7B:
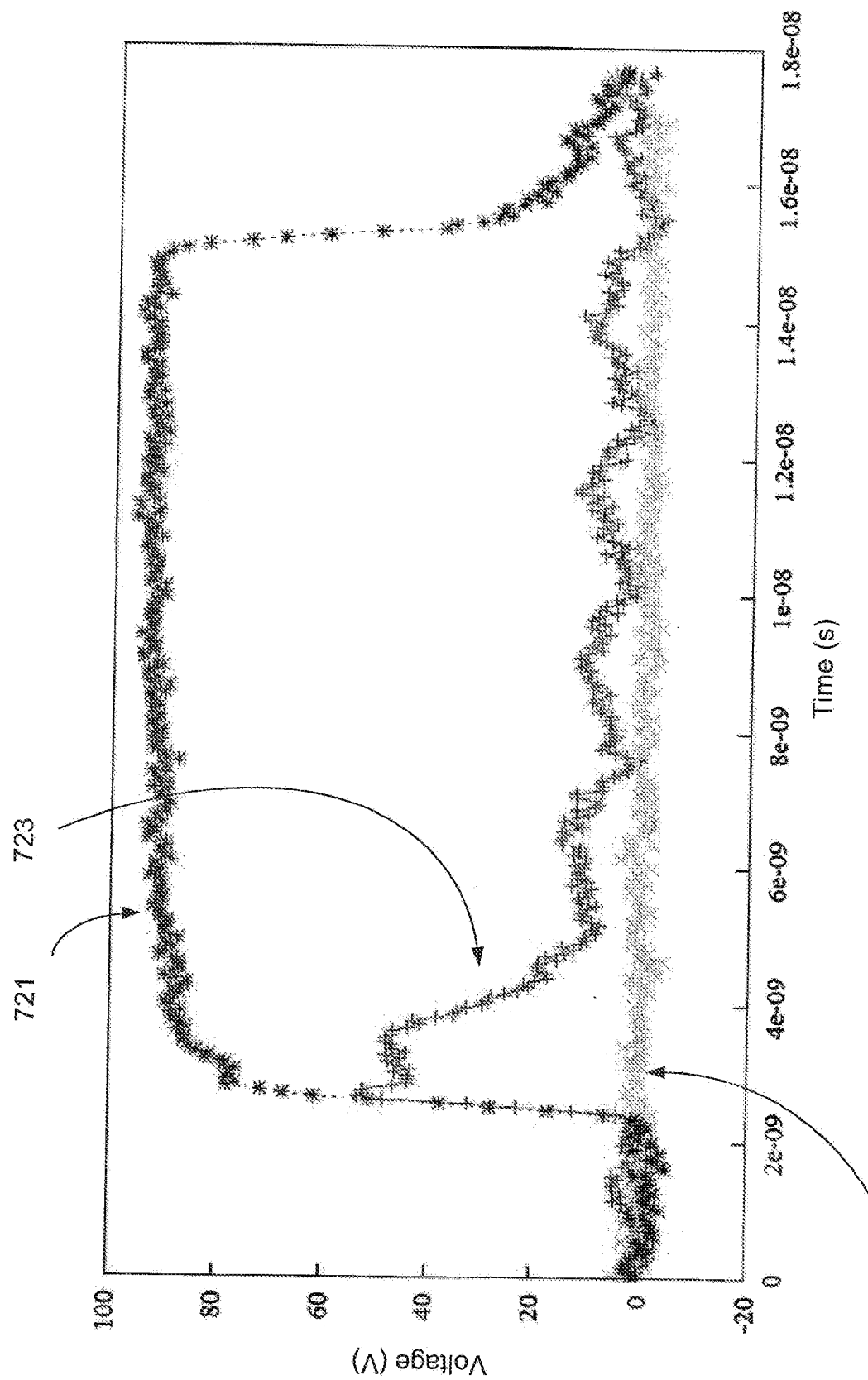
FIG. 7B shows an illustrative comparison of voltages across the device to be protected in response to a transient pulse.
Figure 7C:
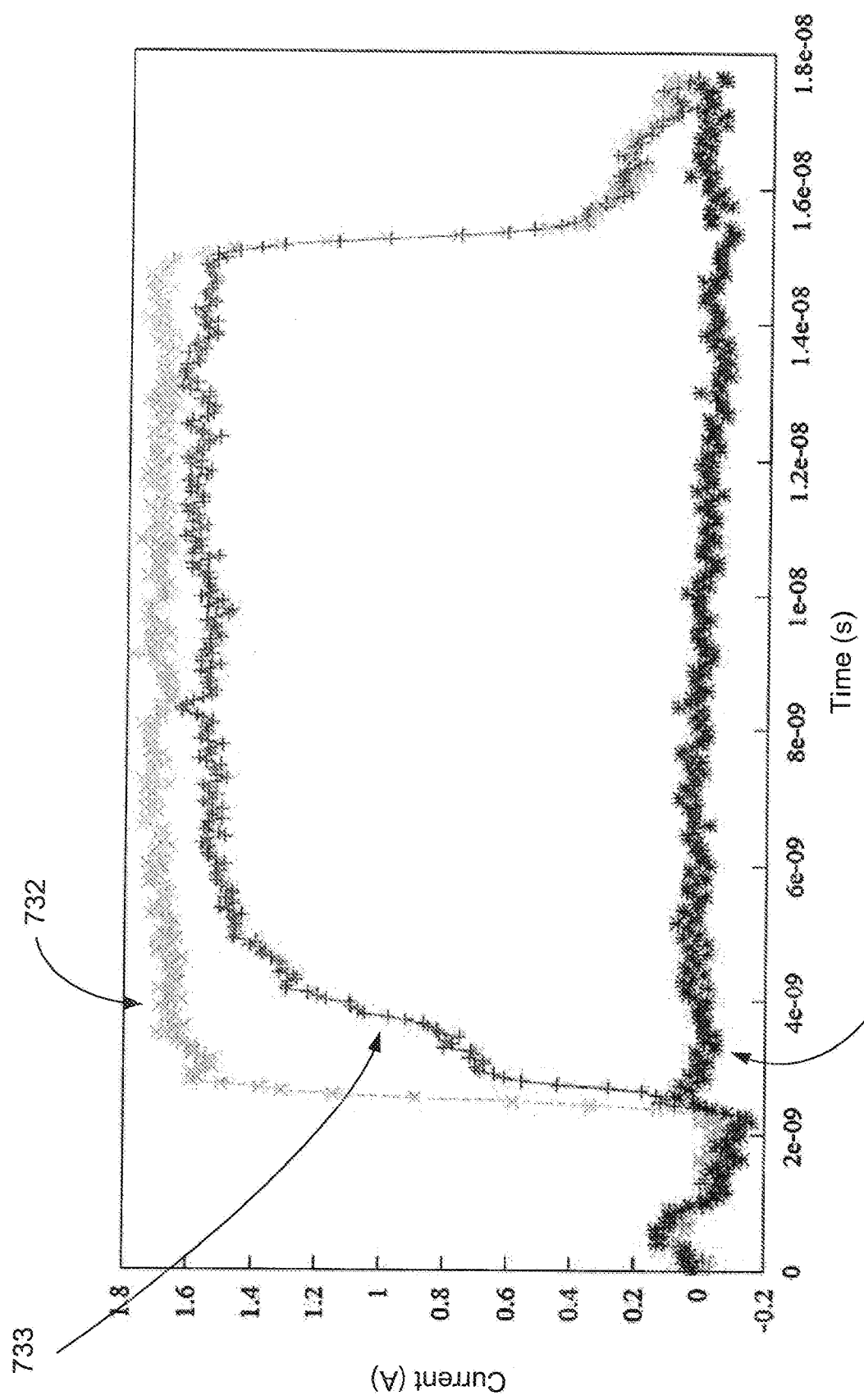
FIG. 7C shows an illustrative comparison of currents through the device to be protected in response to a transient pulse.

FIG. 7B and FIG. 7C illustrate the voltage and current during an ESD transient for various levels of ESD protection at a hypothetical node to be protected. In this example, the hypothetical node is not coupled to a client circuit in need of protection. In FIG. 7B, at one extreme (when there is no ESD protection device coupled to the node; i.e., open-circuit), the waveform 721 rises rapidly in response to the input transient, and remains high for the duration of the transient. As would be expected, corresponding waveform 731 of FIG. 7C shows that there is substantially no current through flow at the open-circuited node. Of course, if a client circuit connected to the node were present, and possibly damaged, some current might flow through the node and client circuit.

At the other extreme (if there were a short-circuit from the node to ground), waveform 722 remains at zero volts during the transient, since no potential difference can be maintained across a short-circuit. Corresponding to voltage waveform 722, current waveform 732 shows that there would be significant current through the short-circuited node for the duration of the applied voltage pulse.

In contrast to the open-circuit and short-circuit examples, voltage waveform 723 and current waveform 733 illustrate the voltage and current at a hypothetical node being protected by an embodiment of the present invention (ESD protected). In this example, one terminal of the device is connected to the node, and another other terminal of the device is connected to ground. Initially, the voltage across the device rises along with the input voltage, and current flow is low, similar to the open-circuit case. However, when the voltage reaches the trigger point of the device, the device activates and presents a low-resistance path from the node to ground, similar to the short-circuit case. As such, the voltage across the device drops to a level below the trigger voltage, even though the current through the device may be large. Thus, the node is protected from the transient waveform as the device triggers to allow the charge to flow to ground.

Figure 8A:
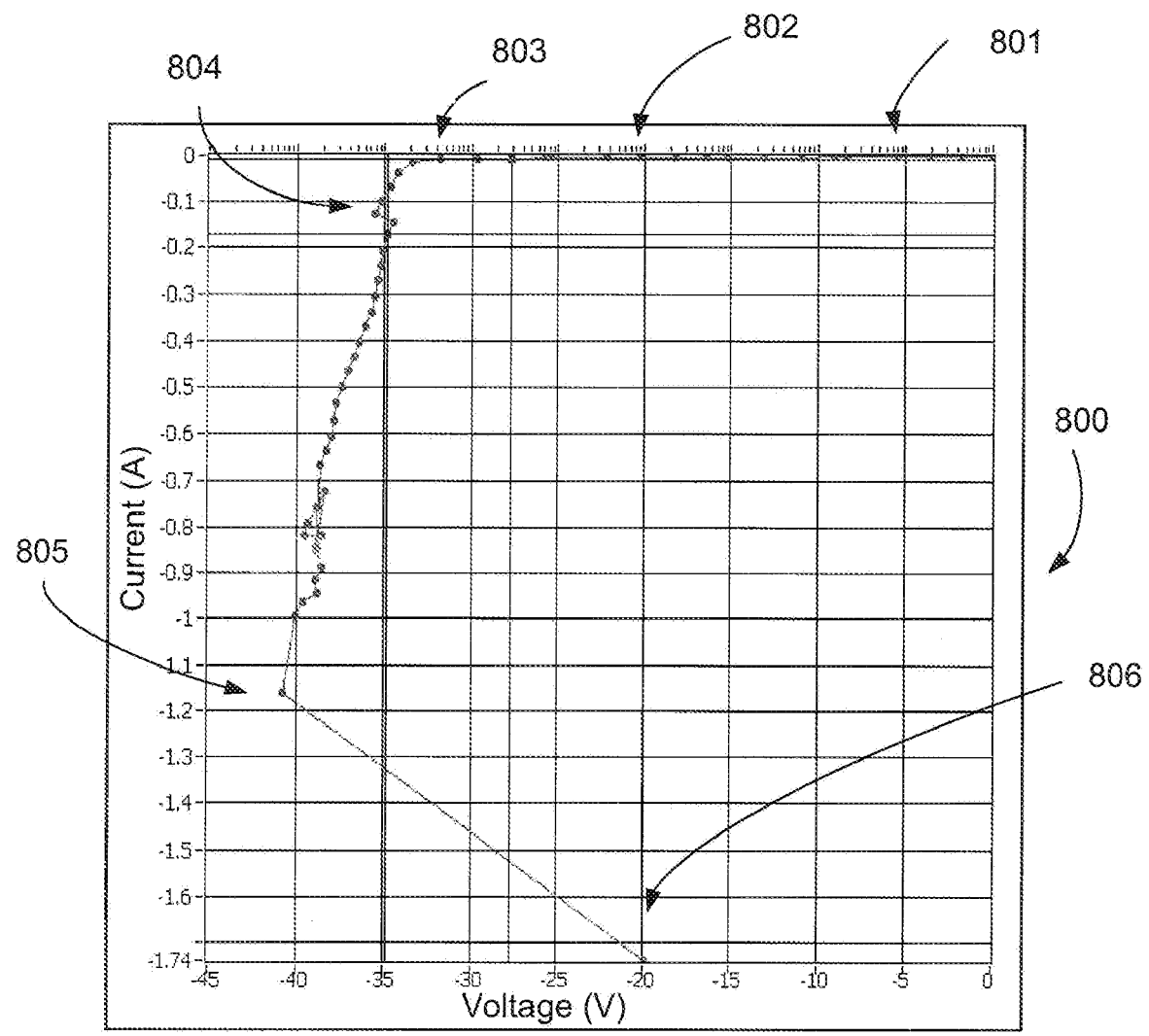
FIG. 8A illustrates the quasi-static very fast TLP response of an unprotected DMOS device to a series of transient voltage pulses of successively greater amplitude.

An application of one embodiment of the present invention is illustrated by FIG. 8A, FIG. 8B, FIG. 9A, FIG. 9B, and FIG. 9C. One method of testing the robustness of a device is to subject it to transient voltages, and then determine how much current flows through the device. Graph 800 in FIG. 8A shows the current through a DMOS device when that device is subject to transient voltages of successively greater amplitude, but not protected by an embodiment of the present invention. Note that because the graph in FIG. 8A shows source-drain voltage, the potential difference across the DMOS device is shown as a negative voltage, with zero volts at the right end of the X-axis, and minus 45 volts at the origin. Similarly, the current through the DMOS devices is zero amperes at the top of the Y-axis, and minus 1.74 amperes at the origin.

Figure 8B:
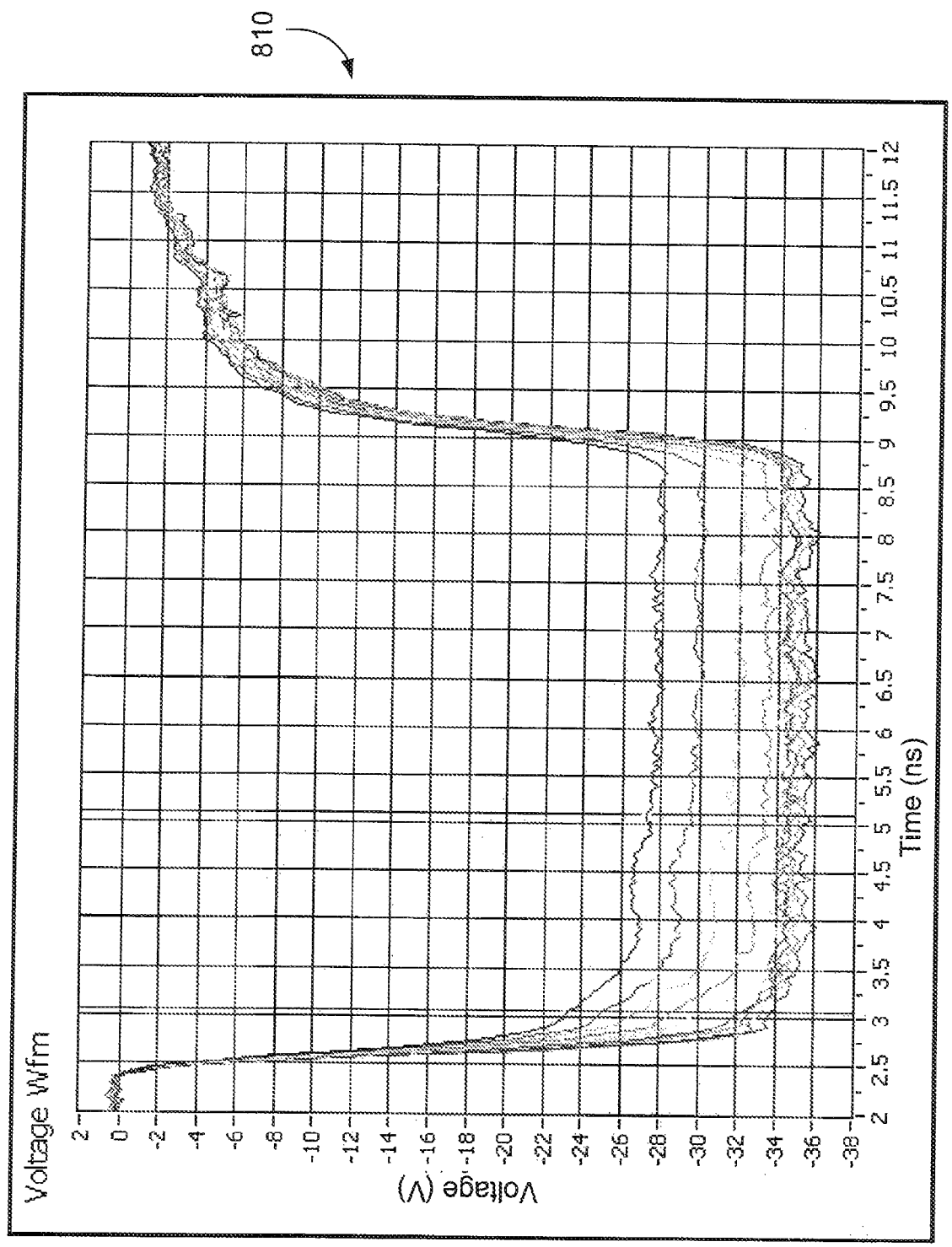
FIG. 8B illustrates a variety of transient voltage pulses of the type applied to the unprotected DMOS device of FIG. 8A.

Several transient voltage waveforms are illustrated in graph 810 in FIG. 8B, in which each transient is of substantially identical duration, but each has a unique amplitude. The illustrative voltage pulses in graph 810 in FIG. 8B show the relatively high voltage build-up that may occur across the DMOS device, for example, for consecutive pulses of increasing amplitude beginning at approximately minus 28 volts (i.e., an amplitude below the point 803 in FIG. 8A), and the point at which the current flow reaches minus 0.2 Amperes (i.e., an amplitude above the point 804 in FIG. 8A).

The first transient voltages applied to the DMOS device in this example is of a relatively low potential, and produce little current flow through the device. For example, at point 801 the voltage is approximately minus 5.5 volts, while the current is approximately zero amperes. Similarly, at point 802, the transient reaches approximately minus 20 volts, while the current is still approximately zero amperes. Even at approximately minus 32 volts, the current has not increased substantially from the first transient, as illustrated by the point 803.

However, as shown by point 804, when the applied transient amplitude is approximately minus 36 volts, more current (approximately minus 0.11 amperes) begins to flow through the DMOS device. Succeeding points illustrate trend that an increase in the amplitude of the voltage transient induces increased current flow. At a voltage of approximately minus 41 volts, the current has reached approximately minus 1.15 amperes, as shown at point 805.

Eventually, the DMOS device is damaged by the transient, and thus no longer functions normally. For example, after the DMOS device has been damaged, a transient of approximately minus 20 volts produces a current of minus 1.74 amperes (see point 806), which is far greater than the current produced by the same voltage before the DMOS device was damaged (compare point 806 to point 802).

Figure 9A:
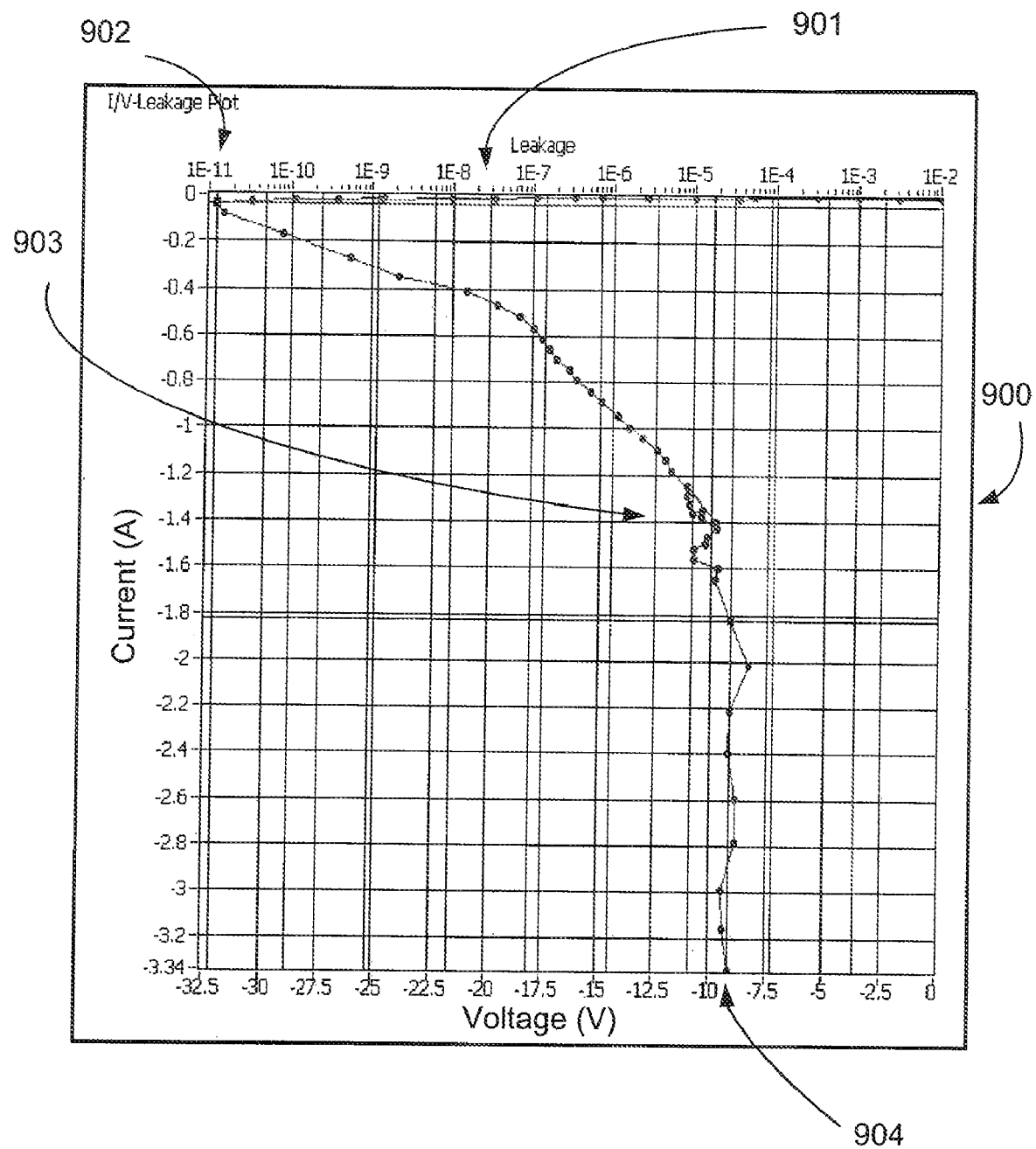
FIG. 9A illustrates the quasi-static very fast TLP response of an embodiment of the present invention to a series of transient voltage pulses of successively greater amplitude.
Figure 9B:
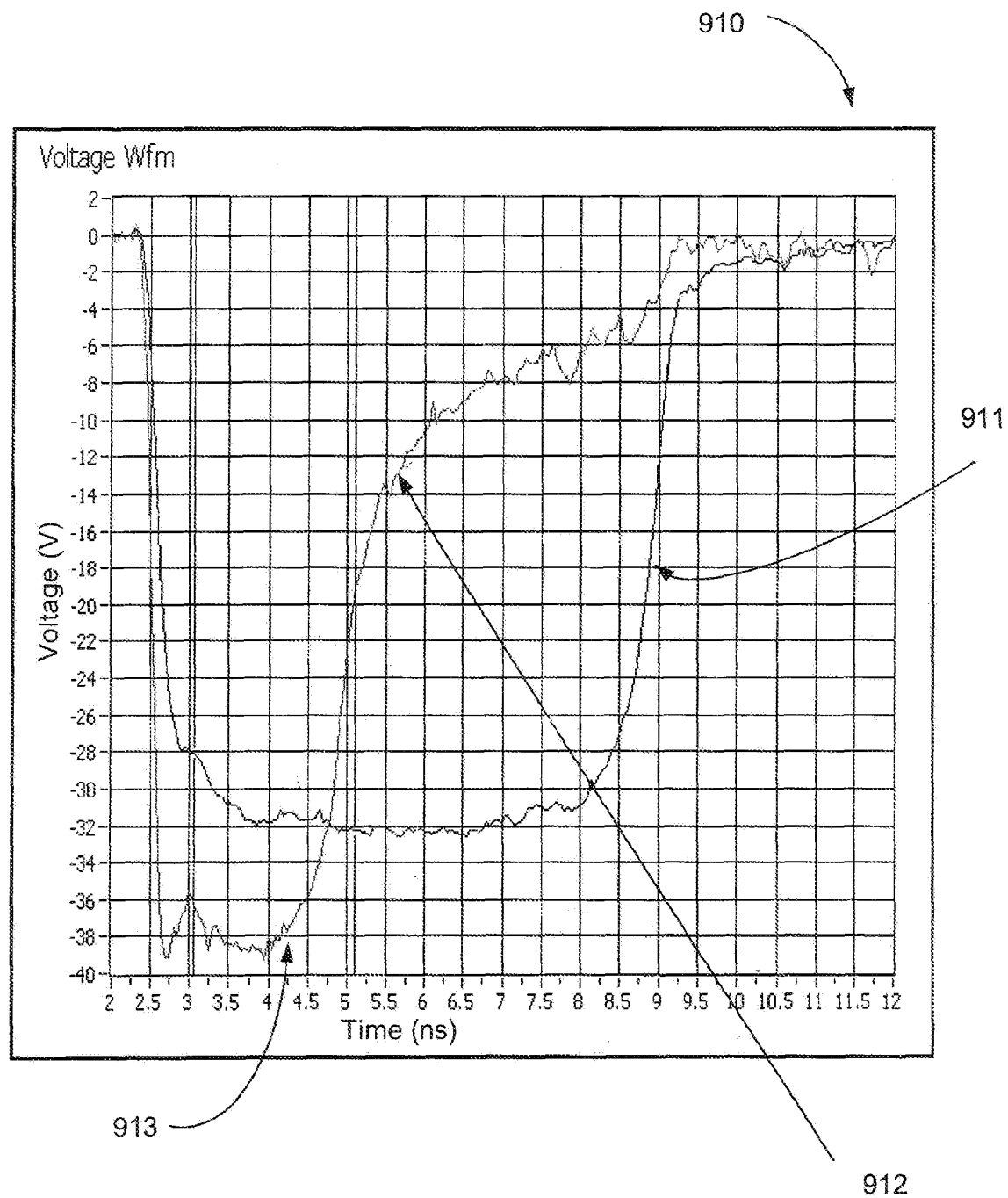
FIG. 9B illustrates an exemplary transient voltage pulse, and the voltage across an embodiment of the present invention.
Figure 9C:
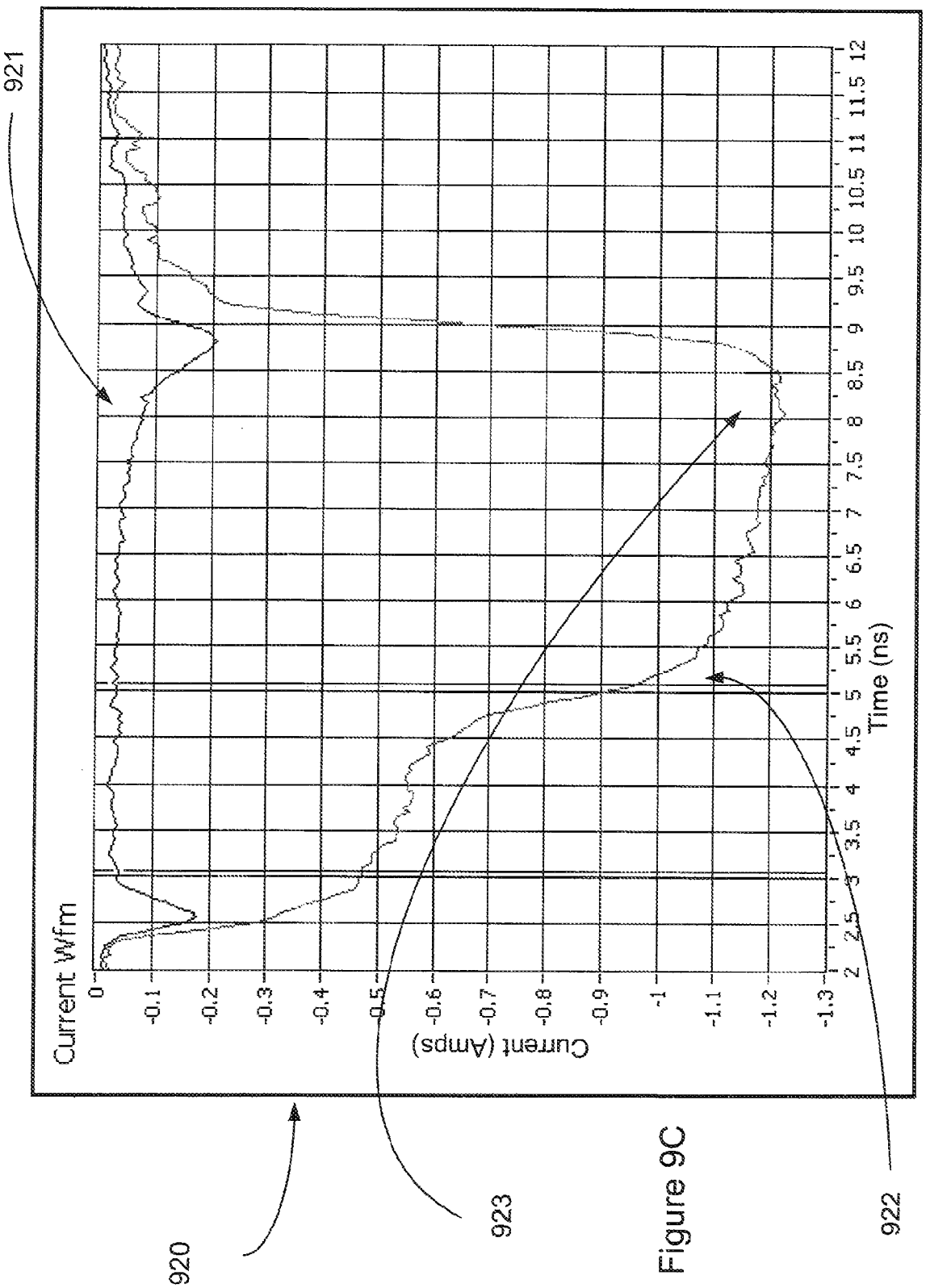
FIG. 9C illustrates the amount of current through an exemplary DMOS device, and the current through an embodiment of the present invention, when an embodiment of the present invention is electrically parallel to the exemplary DMOS device.

In contrast, FIG. 9A, FIGS. 9B, and 9C illustrate the reaction of a DMOS devices that is protected by being electrically parallel to an embodiment of the present invention when subjected to similar transient voltages. For illustrative purposes, this embodiment of the present invention will be referred to in this example as device 300 (with terminal 327 coupled to the drain of an illustrative client DMOS device, and terminal 325 coupled to the source of the illustrative DMOS device), although the device may be implemented in a variety of ways, and (as noted above) reference to device 300 herein does not limit the scope of the invention or the ways in which it can be applied. Also, in this example, the DMOS device will be referred to as the "client DMOS," although a variety of devices may be protected by various embodiments of the present invention, and client circuits are not limited to DMOS devices. The voltage applied to the devices may be a transmission line transient or other source of voltage, but will be referred to in this example as a transient.

Graph 900 of FIG. 9A illustrates the reaction of device 300 to transient/transmission line pulsed voltages of successively greater amplitude. As illustrated in FIG. 8A, the client DMOS can withstand some voltage transients between its drain and source, and so the device 300 does not need to trigger at relatively low voltages. For example, a transient amplitude of minus 20 volts will not cause the device 300 to begin to conduct substantial current, as illustrated by point 901 in FIG. 9A.

Rather, device 300 is designed and implemented to trigger at a voltage above the normal operating voltage of the client DMOS, but lower than a voltage that would damage the client DMOS. When the magnitude of the transient voltage reaches an amplitude at or above the trigger voltage, device 300 activates to drain the overvoltage charge, producing a current through the device 300 and thereby reducing the voltage across the client DMOS, as illustrated in FIG. 9B and FIG. 9C. For example, a transient amplitude of −32.5 volts will cause the device 300 to begin to conduct substantial current, as illustrated by point 902 in FIG. 9A. When device 300 beings to conduct, the voltage across the device decreases, even as the current through the device increases, as illustrated by the points between point 902 and point 903 in FIG. 9A.

The applied voltage transient is illustrated by plot 911 in graph 910 of FIG. 9B, and reaches a peak amplitude of approximately minus 32 volts. Simultaneously, plot 912 in FIG. 9B shows the voltage across device 300 that is electrically parallel to the client DMOS. Note that in FIG. 9B, the zero voltage across the devices is shown near the top of the graph, while increasingly negative potential differences are plotted against the left axis of the graph.

The trigger point of the device 300 is illustrated at approximately point 913 in FIG. 9B, in which the voltage across device 300 (912) initially follows the transient voltage (911), but then is reduced as the device 300 activates. The current through the device 300 is illustrated in graph 920 of FIG. 9C, in which the current through the client DMOS is shown in plot 921, while the current through the device 300 is shown in plot 922. As the device 300 activates, the current 922 through the device 300 increases, and the current 921 through the client DMOS is held to a substantially lower level. In this way, a current transient of approximately 1.2 amperes is diverted away from the client DMOS through the device 300 to protect the client DMOS from damage, as illustrated by point 923 in FIG. 9C. Indeed, device 300 may conduct more than 3 amperes, as shown by point 904 in FIG. 9A. Accordingly, the client DMOS is protected from the over-voltage condition.

Another method of testing the robustness of a device is to subject it to transient voltages of increasingly large amplitude, and determining how much leakage current flows through the device when a known voltage is applied after the transient. In graph 1000 of FIG. 10, the current through the DMOS device (Isub-TLP) is plotted against the Y-axis on the left of the figure, and the leakage current (Isub-Leak) is plotted against the X-axis at the top of the figure, as illustrated by plot 1001. The applied voltage transients are generally not shown, except for the largest transient 1003, in which the amplitude (Vsub-TLP) is plotted against the X-axis at the bottom of the figure, rising from approximately zero volts at point 1006, to a peak of approximately 41 volts at point 1007, and the current through the DMOS device is plotted against the Y-axis (Isub-TLP) as if the device were unprotected.

When the applied transient voltages are relatively small, the current through the device remains small (below approximately 200 ma in the cluster of points 1002) when a potential of 25 volts is applied, and the resulting leakage current remains small even as the transient amplitude is increased (below approximately 1E-10 amperes in the cluster of points 1002).

Figure 10:
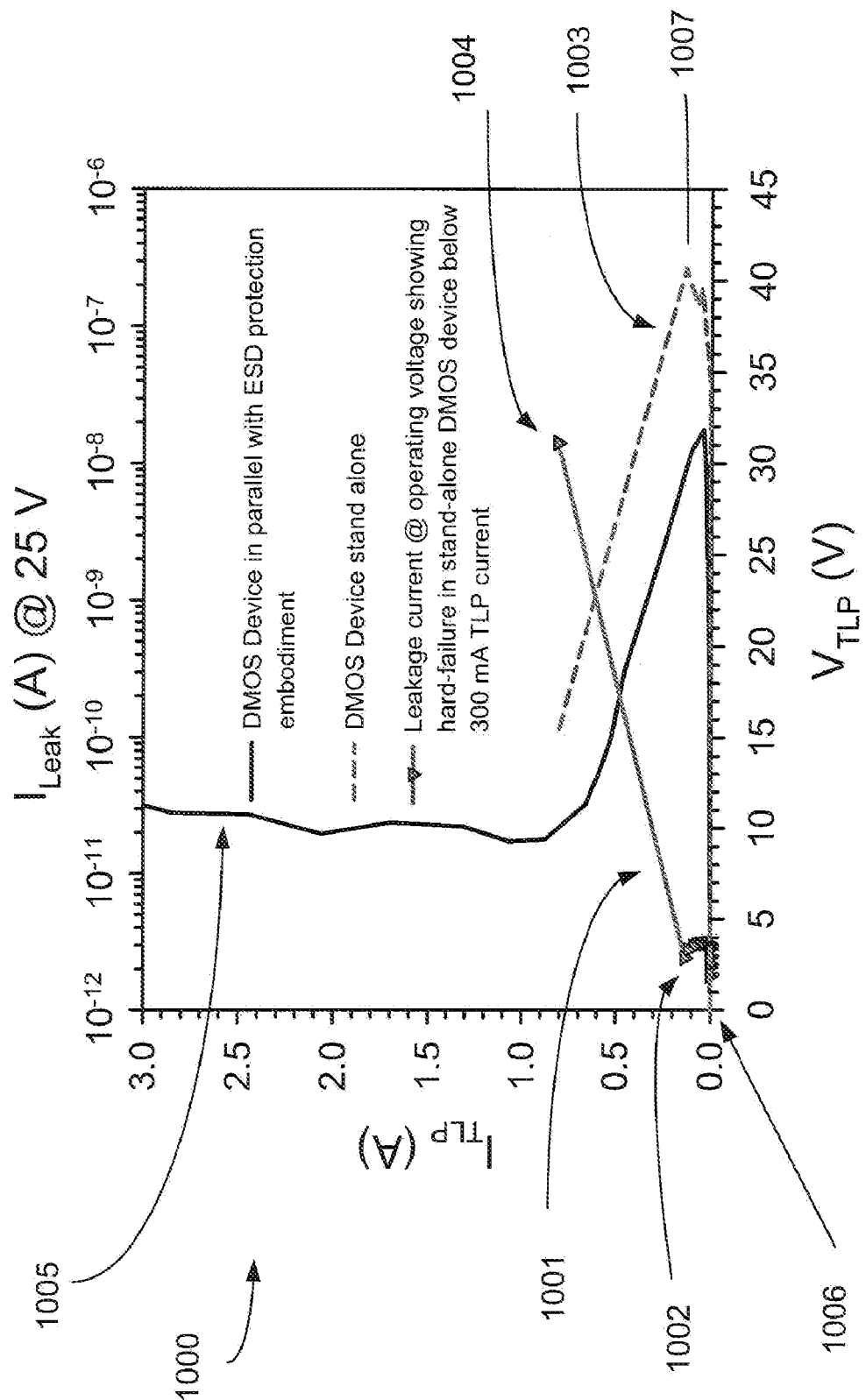
FIG. 10 illustrates the amount of leakage current through an unprotected exemplary DMOS device after being subjected to a series of transient voltage pulses of successively greater amplitude, as well as the voltage across and current through such an exemplary DMOS devices during a transient voltage pulse, and the voltage across and current through an embodiment of the present invention when subjected to a similar transient voltage pulse.

However, the leakage current in the DMOS device increases substantially when the transient amplitude reaches approximately 41 volts, as illustrated by plot 1003 in FIG. 10, during which the current through the DMOS device reaches approximately 0.75 amperes, as illustrated by point 1004. Point 1004 also shows that the leakage current through the DMOS device jumps to approximately 1E-8 amperes after this transient.

The DMOS device may be protected by an embodiment of the present invention arranged electrically parallel to the DMOS device, and implemented to trigger at a voltage less than the voltage that would damage the DMOS devices. The voltage across, and current through, such an embodiment is illustrated by plot 1005 in FIG. 10. In this illustration, the device 300 triggers at a voltage of approximately 32 volts, and then reduces the voltage across itself and the client DMOS device to less than 15 volts, even as the current through the device 300 reaches 3 amperes. In this way, the voltage across the client DMOS device does not reach an amplitude that would damage the client DMOS device.

Although the above discussion discloses various exemplary embodiments of the invention, it should be apparent that those skilled in the art can make various modifications that will achieve some of the advantages of the invention without departing from the true scope of the invention.

TABLE I

| Sections/Regions of opposite conductivity type | Example Surface peak concentration- (atoms/cm$^{-3}$)/ or Peak concentration (atoms/cm$^{-3}$) & [peak depth as referenced to the semiconductor surface (μm)] | Approximate metallurgical junction depth in regions of appositive conductivity type (μm) |
|---|---|---|
| Semiconductor substrate 302 | 1E15 | NA |
| Deep N well 320 | 3E16 | 6.4 |
| N wells 317 & 318 | 9E16 | 2.9 |

TABLE I-continued

| Sections/Regions of opposite conductivity type | Example Surface peak concentration-(atoms/cm$^{-3}$)/ or Peak concentration (atoms/cm$^{-3}$) & [peak depth as referenced to the semiconductor surface (μm)] | Approximate metallurgical junction depth in regions of appositive conductivity type (μm) |
|---|---|---|
| P well 319 (one illustrative embodiment) | 3.3E17 | 1.4 |
| P well 319 (another illustrative embodiment) | 3.2E17 | 1.6 |
| Terminals 311 and 312 | 1.9E20 [0.1] | 0.31 |
| Terminals 306 and 307 (one illustrative embodiment) | 1.9E20 [0.1] | N/A |
| Terminals 306 and 307 (another illustrative embodiment) | 1.9E20 [0.1] | N/A |
| Fourth region 303 inside well 319 | 1.5E20 [0.15] | 0.35 |

What is claimed is:

1. A semiconductor device comprising:
   a first terminal region comprising a first terminal of a first conductivity type within a first well of a second conductivity type;
   a boundary layer of the second conductivity type bounding the first well, and having a different doping concentration and peak junction depth than the first well; and
   a second terminal region comprising a second terminal of the second conductivity type formed in at least a portion of a second well of the first conductivity type, the first well and boundary layer being spaced from the second well.

2. A semiconductor device according to claim 1, further comprising a third well of the first conductivity type disposed between the first terminal region and the second terminal region.

3. A semiconductor device according to claim 2, wherein the first and second terminal regions are formed on a substrate that is of the second conductivity type.

4. A semiconductor device according to claim 2, wherein the third well is disposed between the substrate, at least a portion of the lower boundary of the first terminal region, and at least a portion of the lower boundary of the second terminal region.

5. A semiconductor device according to claim 2, wherein the first terminal region further includes a third terminal 1 of a second conductivity type.

6. A semiconductor device according to claim 2, wherein the second terminal region further includes a fourth terminal of a first conductivity type.

7. A semiconductor device according to claim 2, wherein the doping concentration of the third well is lower than the doping concentrations of second well, and the first terminal.

8. A semiconductor device according to claim 1, wherein one terminal region of the device includes a semiconductor of the first conductivity type having at least three regions of doping of the same conductivity type, each region having a doping concentration different than the other regions.

9. A semiconductor device according to claim 1, further comprising a fourth well of the second conductivity type circumscribing the first terminal region and the second terminal region.

10. A semiconductor device according to claim 9, wherein the fourth well is electrically coupled to the first terminal region.

11. An over-voltage protection device comprising regions of N-type and P-type doping, separated by insulators, comprising:
   a central terminal comprising doped silicon of a first type;
   a first insulator circumscribing the central terminal region;
   a second terminal comprising doped silicon of a second type circumscribing the first insulator;
   alternating regions of insulators, P-type silicon, and N-type silicon; and
   an P-type well underlying the central terminal, first insulator, and second terminal.

12. An over-voltage protection device of claim 11, wherein the central terminal is of N-type silicon and the second terminal is of P-type silicon, the circumscribing regions circumscribing the second terminal in the following order:
   a. Insulator;
   b. P-Type;
   c. Insulator;
   d. N-type.

13. An over-voltage protection device of claim 11, wherein the central terminal is of P-type silicon, and the second terminal if of N-type silicon, the circumscribing regions circumscribing the second terminal in the following order:
   a. Insulator;
   b. P-Type;
   c. Insulator;
   d. N-type.

14. An over-voltage protection device comprising regions of N-type and P-type doping, separated by insulators, comprising:
   a central terminal comprising doped silicon of a first type;
   a first insulator circumscribing the central terminal region;
   a second terminal comprising doped silicon of a second type circumscribing the first insulator;
   alternating regions of insulators, P-type silicon and N-type silicon; and
   an N-type well underlying the central terminal, first insulator, and second terminal.

15. An over-voltage protection device of claim 14, wherein the central terminal is of N-type silicon and the second terminal is of P-type silicon, the circumscribing regions circumscribing the second terminal in the following order:
   a. Insulator;
   b. N-Type;
   c. Insulator;
   d. P-type.

16. An over-voltage protection device of claim 14, wherein the central terminal is of P-type silicon and the second terminal is of N-type silicon, the circumscribing regions circumscribing the second terminal in the following order:
   a. Insulator;
   b. N-Type;
   c. Insulator;
   d. P-type.

17. A method of fabricating an over voltage protection device, the method comprising:
   fabricating a boundary layer comprising a well of one of a P-type layer or an N-type layer;
   fabricating a first terminal region, the first terminal region including at least one N-type region formed in a P-type well; and
   fabricating a second terminal region spaced from the first terminal region by a separation region, the second terminal region including at least one P-type region formed in a N-type well,
   wherein one of the first terminal region and the second terminal region is bounded by the boundary layer and the terminal region and boundary layer are of the same doping type but different doping concentrations and peak depths.

18. A method according to claim 17, wherein fabricating the first terminal region further includes at least one P-type region formed in the P-type well.

19. A method according to claim 17, wherein fabricating the second terminal region further includes at least one N-type region formed in the N-type well.

20. A method according to claim 17, wherein:
   fabricating the first terminal region further includes at least one P-type region formed in the P-type well; and
   fabricating the second terminal region further includes at least one N-type region formed in the N-type well.

* * * * *